United States Patent [19]

Ohnishi

[11] 4,075,395

[45] Feb. 21, 1978

[54] HYBRID FRAMEWORK CONSISTING OF METALLIC PLATE AND PROJECTIONS MADE OF SYNTHETIC RESIN

[75] Inventor: Masanori Ohnishi, Katano, Japan

[73] Assignee: Matsushita Electric Industrial Co., Ltd., Kadoma, Japan

[21] Appl. No.: 664,037

[22] Filed: Mar. 4, 1976

[30] Foreign Application Priority Data

| Mar. 7, 1975 | Japan | 50-28531[U] |
| Mar. 7, 1975 | Japan | 50-28532[U] |
| Mar. 7, 1975 | Japan | 50-28533 |
| Mar. 7, 1975 | Japan | 50-28534 |
| Mar. 19, 1975 | Japan | 50-34066 |
| Mar. 11, 1975 | Japan | 50-33028[U] |
| Mar. 11, 1975 | Japan | 50-33029[U] |

[51] Int. Cl.² ............................................. B32B 9/04
[52] U.S. Cl. ............................................. 428/542; 29/530; 248/19; 248/23; 235/435; 264/328; 264/331; 360/137; 428/131; 428/137; 428/139
[58] Field of Search .................. 29/530; 248/19, 23; 428/131, 137, 138, 139, 140, 542; 360/137, 96, 60; 264/328, 331; 235/61.11 D

[56] References Cited

U.S. PATENT DOCUMENTS

| 3,753,846 | 8/1973 | Trouilbet | 428/139 |
| 3,898,687 | 8/1975 | Schmidt | 235/61.11 D |
| 3,899,795 | 8/1975 | Watanabe | 360/105 |
| 3,962,660 | 6/1976 | Duckett | 248/19 |

FOREIGN PATENT DOCUMENTS 789,746  1/1958  United Kingdom ............. 174/138.5

*Primary Examiner*—William R. Dixon, Jr.
*Attorney, Agent, or Firm*—Wenderoth, Lind & Ponack

[57] ABSTRACT

When constructing an electrical or electronic device or mechanical device such as a tape recorder, the framework therefore must be provided with various projections for installing various components to be contained therein, or means such as spring means for actuating the mechanism incorporated thereon must be previously provided on the framework. The present disclosure relates to those projections made of synthetic resin which can be integrally formed on a metallic plate in the step of molding and also to those molded projections which may not deform their configuration by the shrinking force of the synthetic resin when molded integrally with the plate to form the framework.

19 Claims, 85 Drawing Figures

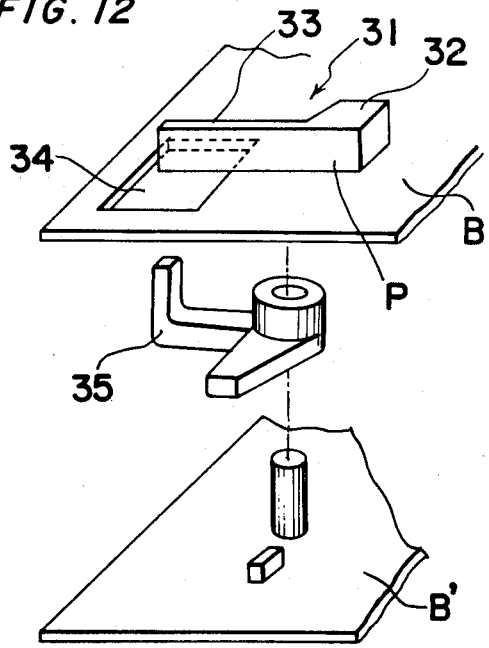
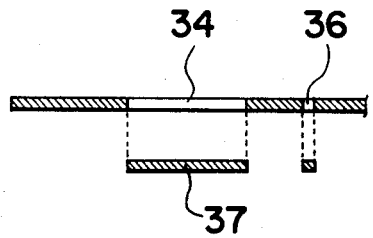
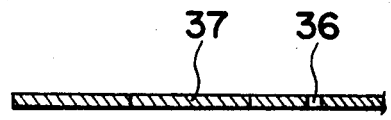
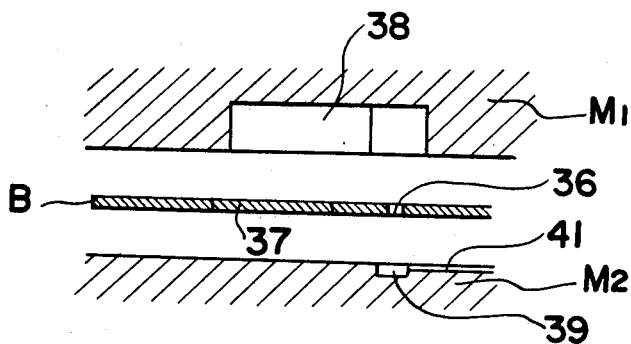
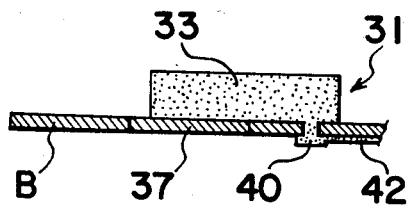
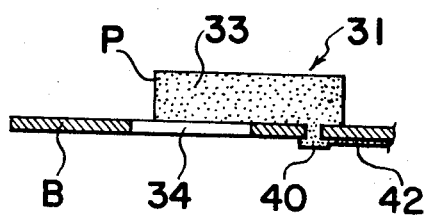

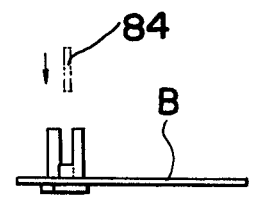
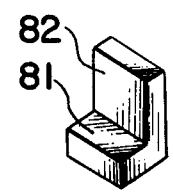
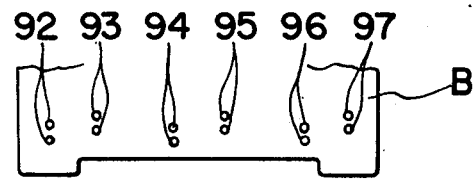
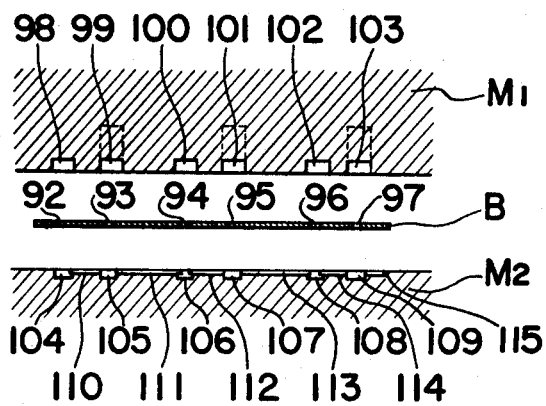
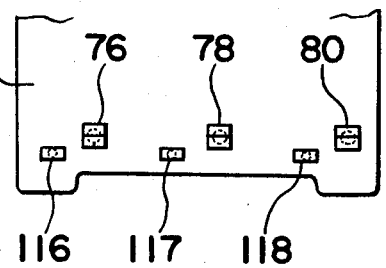

HYBRID FRAMEWORK CONSISTING OF METALLIC PLATE AND PROJECTIONS MADE OF SYNTHETIC RESIN

The present invention relates to a hybrid framework consisting of a metallic plate and one or more projections secured thereto for use in an electrical or electronic device such as a tape recorder, more particularly, to a framework mainly consisting of a metallic plate and projections made of synthetic resin material rigidly secured to the metallic plate by an injection molding, and also to a method therefor.

In constructing an electrical or electronic device such as a tape recorder or the like, various components incorporated therein, for example a printed circuit plate, a transformer, a motor and a speaker if any, etc., are normally spaced from a chassis or a framework therefor, by projections fixedly mounted on the surface of the framework. Additionally, the framework of such device as described above is further provided with other projections for use in actuating various mechanism incorporated therein. Such latter projections include, for example, a leaf spring, which is employed in association with a rotary switch unit, wherein one end portion of the leaf spring is secured to the framework and the other end portion thereof urges a cam plate of the rotary switch unit by the effect of its own elastic force so that the cam plate can be held in any one of operating position, or another projection for effecting the mechanism which may be a guide block for reciprocatingly supporting a movable member, or a case block for receiving part of mechanism therein.

Moreover, if the framework of such device consists of several layers, it is necessary to form suitable openings in the framework so that the mechanism provided on one layer may be operated from the other layer by arm means mechanically connecting mechanisms provided on the two layers through the opening, or in order that one of the components provided on the lawer layer may be more firmly supported thereat by socketing the head portion of the component fixedly into the opening formed in the upper layer. For the former purpose opening may be provided with another arm means extending across the opening for sensing the movement of the first arm means. On the other hand, for the latter purpose the opening must be formed with accuracy for exactly receiving the head portion therein.

Such projections and openings as described above are preliminarily formed on the framework before assembling the various components and mechanism thereon. Conventionally, these projections are formed through methods as described hereinbelow.

According to one conventional method, the above described projections, usually made of synthetic resin such as thermoplastics, are preliminarily molded into preferable configurations in an independent process before being mounted on a framework of an electrical device. During assembling, each of the projections is placed on the framework at a predetermined position, and then fixedly mounted thereon one by one, by suitable securing means such as securing screws, or otherwise by insertion thereof into an opening formed in the framework, so that the projections may securely hold various components or actuate the mechanism to be incorporated in the device.

On the other hand, according to another conventional method which is applied in the case where the framework is made of synthetic resin, these projections may be integrally formed on the framework in molding the latter.

However, the above described conventional methods hitherto employed to form projections on the framework have numerous disadvantages as described hereinbelow.

In the former method, it is necessary to keep a number of pieces for those projections in order before mounting them on the framework, and also these projections are prepared in one independent process, while mounting them fixedly on the framework is effected in another process. These two processes may not only require extra constructing process, but also result in the increase of manufacturing cost for the device, as compared with a process which includes these two processes in one constructing process.

In the latter method, although the above described two processes, i.e., the process for constructing the projections and the process for mounting them on the framework are effected in one process, the projections may not be formed at the predetermined positions with accuracy, due to the fact that the distortion of the synthetic resin may deform the projections undesirably, or that uneven shrinkage of the synthetic resin may direct the projections in indefinite directions. Furthermore, the framework made of synthetic resin is not suitable for the devices of large size, especially when the framework is of thin-gauge because the lack of stiffness in the synthetic resin may not support the components to be contained therein, and also the larger the mass of the synthetic resin becomes, the greater the distortion will be, due to its shrinkage.

Therefore, it is a primary object of the present invention to improve constructing process of an electrical device or mechanical device by molding synthetic resin parts directly on a metallic framework therefor, and to present the synthetic resin parts fixedly mounted on the metallic framework by an improved constructing process.

Another object of the present invention is to provide a plurality of synthetic resin parts in one molding process by providing runners between the synthetic resin parts.

Further object of the present invention is to provide suitable correcting means to the synthetic resin parts for correcting distortion of the synthetic resin parts arranged on the framework.

According to the present invention, the foregoing objects and others are accomplished by molding the synthetic resin directly on the framework in such a manner as described hereinbelow.

Before molding the synthetic resin parts on the framework, the metallic framework must be formed with openings at predetermined positions for forming the synthetic resin parts around said openings. Then each of these openings is completely surrounded by walls of a cavity formed by two molding blocks holding the framework therebetween. One of the blocks, which faces the upper surface of the framework, where the projections must be formed, has a recess having a shape of projection to be molded, and the other block which faces the lower surface, also has a shallow recess at corresponding position to the first recess formed on the former block.

When these two blocks tightly hold the framework, therebetween, the recess formed in the upper block, and corresponding recess formed in the lower block form a cavity by connecting these two recesses through the opening formed in the framework.

The cavity formed by the two blocks is filled with plasticized synthetic resin by any known means such as by a plastic injection-molding machine. When the product in the cavity is hardened by the cooling effect and the mold block is opened, the product ejected therefrom is fixedly secured to the metallic framework. In other words, the ejected product tightly holds the edge of the opening formed in the metallic framework because of the fact that a lump of synthetic resin formed immediately under the framework by the shallow recess tightly engages with the opening as in riveting, due to shrinkage of synthetic resin forming the product.

Although, it is possible to install the projection on one or two circular openings formed in the framework, especially when they are small in size, the projections in large size, such as the case block, may not possibly be held on the framework by one or two openings. However, on the other hand, if such a large projection were to be held on the framework by several openings, the shrinkage of synthetic resin may cause the projection to yield an undesirable distortion, since the shrinkage normally proceeds towards the center portion of the product.

According to the present invention, such large projection is installed on an opening having number of grooves formed on the framework radially extending outwardly from the center portion of the opening, thus the bottom portion of the product may shrink towards the center portion thereof in relation to the other portions thereof, and as a result, the whole product may shrink evenly.

Therefore, the product fixedly formed on the framework at openings can be readily used as projections for holding the various components to be incorporated in the device or for actuating mechanism incorporated therein, or for other purposes.

Although the projections in the foregoing description are described as formed individually one by one, it is possible, according to the present invention, to form a plurality of synthetic resin products, i.e., projections on the framework in one molding operation by connecting the cavities for the products with channels, or grooves for forming runners. Each cavity serves as the mold for a single item, i.e., the spacer projection the guiding projection, the leaf spring, etc. Although the small items themselves may not shrink to such a degree to distort the original configuration thereof, the shrinkage of the runners connecting the items may undesirably enforce the items to incline or rotate. Therefore, according to the present invention, there runners are provided with further auxiliary runners for forcibly preventing the former runners from those undesirable distortions, or otherwise these former runners are molded in such a form that the shrinking force of the runners may not cause the items to be distorted.

Since the runners are provided only for connecting the products, these runners may be removed after being ejected from the mold. However, such an operation to remove the runners may be unnecessary if the runners do not hinder the component or mechanism to be incorporated in the device. For those runners which hinder the component or mechanism, they may be formed in such a manner as to detour the component or mechanism to be spaced from the position of the component or mechanism.

These and other objects and features of the present invention will become apparent from the following description taken in conjunction with preferred embodiments thereof with reference to the accompanying drawings, in which:

FIG. 12 is a fragmentary exploded view of the framework F, showing a part of mechanism coupled with the leaf spring;

FIGS. 13 and 14 are fragmentary cross sectional views of the base plate, showing the openings to be formed in the base plate for forming the leaf spring together with the cut out pieces;

FIG. 15 is a fragmentary cross sectional view of the base plate for forming the leaf spring, and showing the relation between the upper and lower molding blocks;

FIG. 16 is a fragmentary side sectional view of the ejected leaf spring;

FIG. 17 is a similar view to FIG. 16, but particularly shows the ejected leaf spring after the cut out piece is removed;

FIG. 28 is a side view of the series of guiding blocks shown in FIG. 27;

FIG. 29 is a perspective view of one of the guiding blocks shown in FIG. 26 to 28;

FIG. 30 is a fragmentary top plan view of the base plate for forming series of guiding blocks shown in FIGS. 26 to 28;

FIG. 31 is a fragmentary side sectional view of the series of guiding blocks shown in FIGS. 26 to 28, showing the relation between the upper and lower molding blocks;

FIG. 32 is an explanatory diagram for the series of guiding blocks shown in FIGS. 26 to 28;

FIG. 33 is a similar view to FIG. 26, but particularly shows a modification thereof;

Referring to FIGS. 1 to 4, there is shown a completed piece of a framework F for use in a device, for example, a tape recorder, which comprises a metallic base plate B and a plurality of synthetic resin products which are generally called projections P, and fixedly mounted on the base plate B for holding components (not shown) to be incorporated in the device or for actuating the mechanism incorporated in the device. These projections P made of synthetic resin such as polyacetal, are formed by a process of injection moding which forms a plurality of projections at a time, so that one molding process may produce a plurality of projections P fixedly formed on the base plate B.

Figure 5:
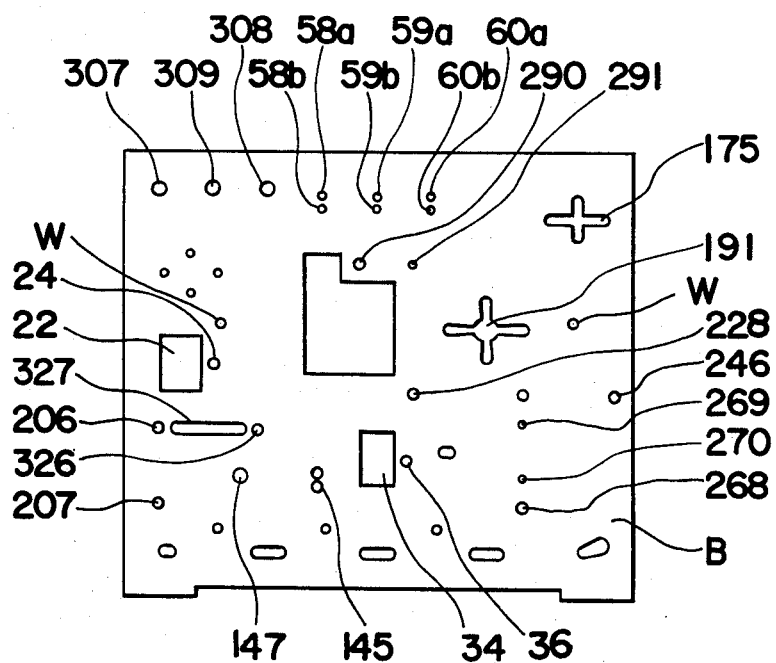
FIG. 5 is a top plan view of the base plate B.
Figure 6:
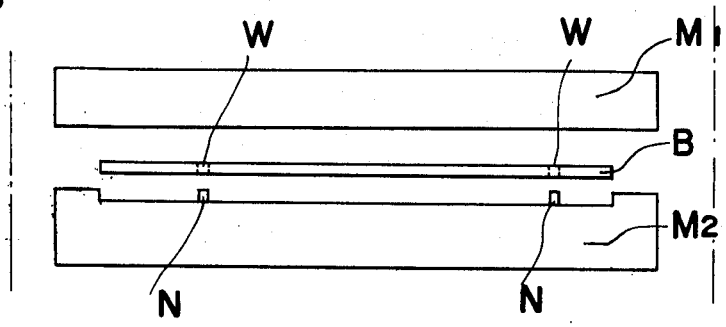
FIG. 6 is a schematic side view of the base plate B together with the upper and lower molding blocks $M_1$ and $M_2$.

In order to form such projections P on the base plate B, the base plate B is preliminarily provided with openings at the positions where the projections P are to be formed as shown in FIG. 5. Detailed description for each of the openings are described later in connection with the description for each of the projections P. The base plate B with the openings are then held between upper and lower molding blocks $M_1$ and $M_2$. For the purpose of convenience, the pair of upper and lower molding blocks $M_1$ and $M_2$ may be divided into several pairs. The upper molding block $M_1$ is provided with recesses each of which correspond with the configuration of each projection P. On the other hand, the lower molding block is provided with shallow recesses at corresponding position to the recesses formed in the upper molding block for forming lump of synthetic resin thereat. When the upper and lower molding blocks $M_1$ and $M_2$ tightly hold the base plate B therebetween, each of the recesses formed in the upper molding block $M_1$ and corresponding recesses formed in the lower molding block $M_2$ form a cavity through the opening formed in the base plate B. The positioning of the base plate B between the molding blocks $M_1$ and $M_2$ is achieved by at least two pins N integrally formed on the lower molding block $M_2$, each of the pins N being introduced into corresponding opening W, formed in the base plate B, as most clearly seen in FIG. 6. Normally on the lower molding block, the shallow recesses are connected to each other by grooves, which forms channels, namely runners when the base plate B is held between the molding blocks. The molten synthetic resin is injected into the cavities from at least one cavity gate. In this case, these cavity gates (not shown) are formed in the lower molding block $M_2$. The reference characters $G_1$, $G_2$ and $G_3$ in FIG. 3. show the positions from which the molten synthetic resin is injected.

Therefore, as a result, each projection P substantially has an extending portion inserted into the opening which is formed in the base plate B, and a lump of synthetic resin integrally formed with the extending portion immediately below the plate B in such a manner to cover up the above mentioned openings.

It should be noted that the recess formed in the lower molding block $M_1$ can be provided with a projection for the purpose of present invention, which will be described in detail in connection with FIGS. 7 to 11.

According to the present invention, those projections are formed in the process of molding by proceeding the following four steps:

a first step is mating the upper molding block $M_1$ with the upper mating surface of the base plate B, and the lower molding block $M_2$ with the lower mating surface of the base plate B, thus forming cavities by the two molding blocks;

a second step is injecting molten synthetic resin into the cavities from the cavity gate with any known injection machine;

a third step is cooling the molding blocks and further injected synthetic resin to solidify the latter; and a fourth step is ejecting the synthetic resin products formed by the molding engaged with the base plate B.

After having completed these molding steps, each of the projections P formed by the mold is fixedly installed on the base plate B because each projection formed on the upper surface of the base plate B and the integrally formed lump of synthetic resin on the lower surface of the base plate B tightly holds the edge of the opening by the effect of shrinkage caused in the synthetic resin in the opening.

Therefore, projections ejected from the mold can be readily used as projections for holding various components or for effecting the mechanism incorporated therein.

Figure 1:
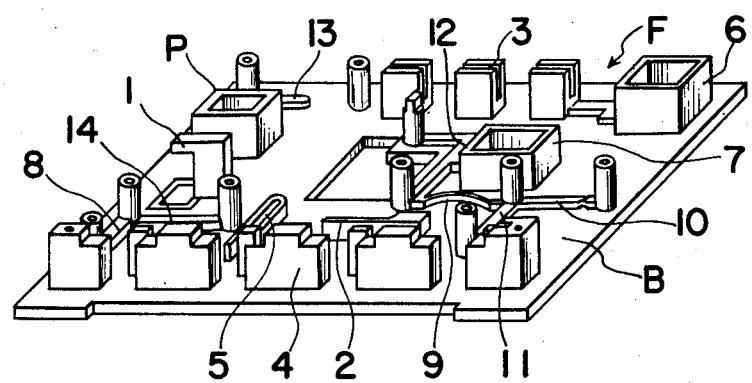
FIG. 1 is a perspective view of a completed framework F.
Figure 2:
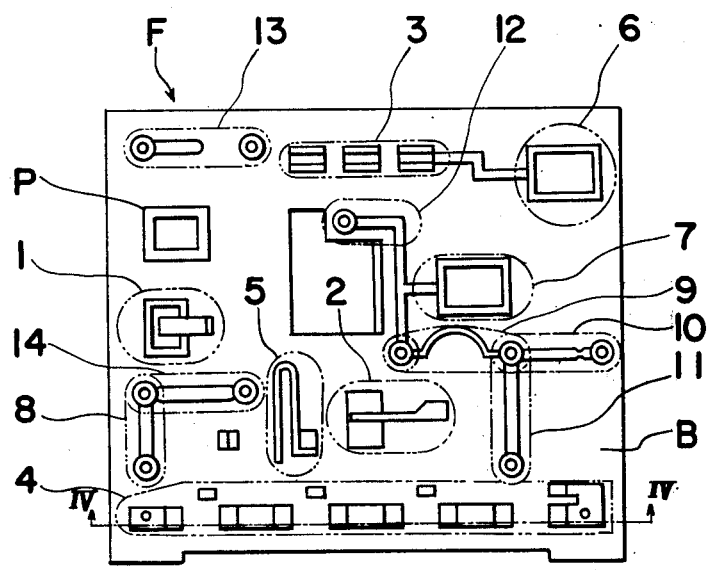
FIG. 2 is a top plan view of the framework F shown in FIG. 1.
Figure 3:
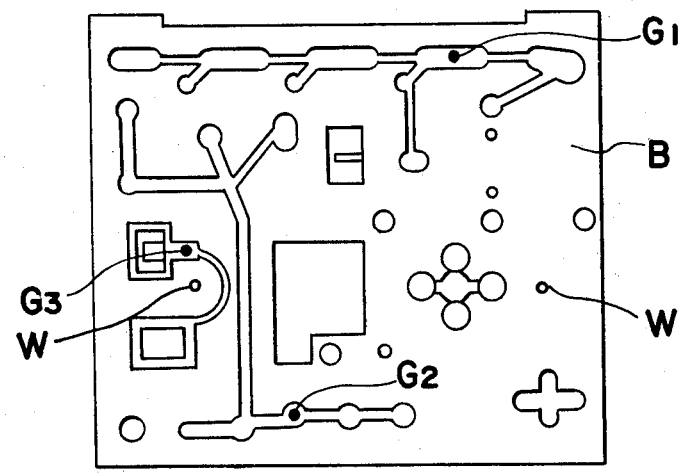
FIG. 3 is a bottom view of the framework F shown in FIG. 1.
Figure 4:
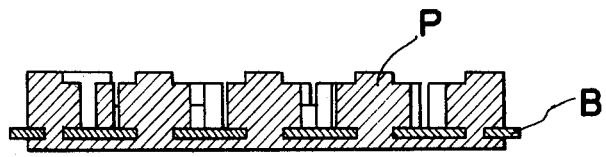
FIG. 4 is a cross sectional view taken along the line IV—IV of FIG. 2.

Referring particularly to FIG. 2, each of the items 1 through 14 encircled by a chain line composes units of the framework F, wherein the numerals 1 through 7 designate individual projections P, while the numerals 8 through 14 designate various runner means which connect two individual projections.

The detailed description for each of the items 1 through 14 are given individually in connection with the attached drawings hereinafter.

ITEM 1

Figure 7:
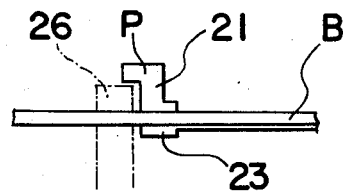
FIGS. 7 and 8 are fragmentary front and top views of the inverted L-shaped projection.
Figure 8:
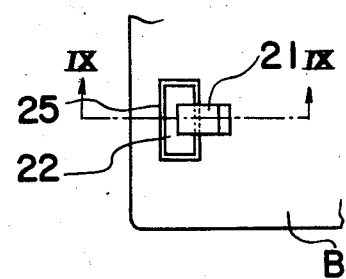
Figure 9:
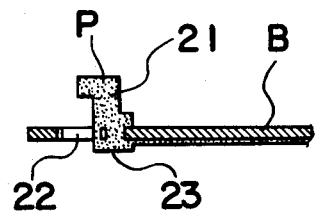
FIG. 9 is a cross sectional view taken along the line IX—IX of FIG. 8.

Referring to FIGS. 7 to 9, there is shown a completed piece of the molded projection P, namely an inverted L-shaped projection 21, installed on the base plate B, while an opening 22 is formed immediately next to the L-shaped projection 21. The L-shaped projection 21, extending upwardly at right angles from the base plate B, is bent at upper portion thereof to cover part of the opening 22. Positioned under the base plate B is a lump 23 of synthetic resin, integrally formed with the inverted L-shaped projection 21 through a small opening 24 formed in the base plate B. Since the size of the lump 23 is greater than that of the small opening 24, the L-shaped projection 21 is fixedly secured to the base plate B. The peripheral edge of the opening 22 is provided with a frame 25 which is also formed by the molding.

The opening 22 is adapted to receive therein, for instance, a head portion 26 of one of the components as shown in a chain line in FIG. 7 and, incorporated below the base plate B, while the L-shaped projection 21 is adapted to engage said head portion 26 inserted into the opening 22 in a position adjacent to the upper bent over portion.

Figure 10:
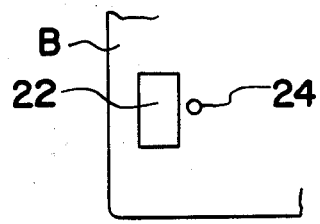
FIG. 10 is a fragmentary top plan view of the base plate before forming the inverted L-shaped projection thereon.
Figure 11:
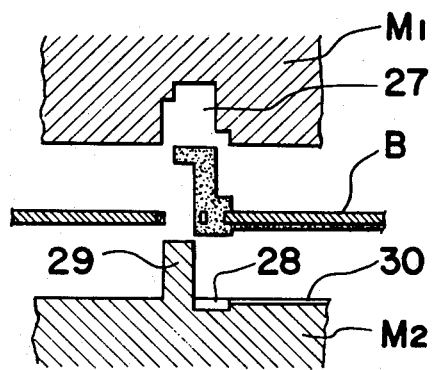
FIG. 11 is a fragmentary cross sectional view showing the relation between the base plate and the upper and lower molding blocks for forming the inverted L-shaped projection.

In order to form such L-shaped projection 21 together with the frame 25 for the opening 22, the metallic base plate B is preliminarily formed with openings 22 and 24, as most clearly seen in FIG. 10. It should be noted that the opening 22 is larger than the opening 24. Then, the base plate B is tightly held between upper and lower molding block $M_1$ and $M_2$, as shown in FIG. 11. The upper molding block $M_1$ has a recess 27 which corresponds with the configuration of the inverted L-shaped projection 21 engaging with above described head portion 26. On the other hand, the lower molding block $M_2$ has a shallow recess 28 which corresponds with the lump 23, and also has a projection 29 extending upwardly from a position immediately next to the shallow recess 28. The projection 29 has a size exactly the same as that of the above described head portion 26. The shallow recess 28 is connected by a groove 30 extending towards one of the neighboring shallow recess (not shown). When these two molding blocks $M_1$ and $M_2$ tightly hold the base plate B therebetween in corresponding position, the cavity formed by the recesses 27 and 28 has exactly the same configuration as the L-shaped projection 21 together with the lump 23.

It should be noted that the projection 29 should not contact any portion of the edges of the openings 26, but should loosely pass through the opening 26, thereby forming a part of cavity between the edge of the opening 26 and the surface of the projection 29.

When the molten synthetic resin is injected into the cavity by any known injection means from a cavity gate (not shown), the molten synthetic resin fills up the cavity. Subsequently, the molding blocks $M_1$ and $M_2$ are cooled by a suitable cooling means (not shown) to solidify the synthetic resin injected therein. Soon after synthetic resin solidifies, the mold is opened and the finished piece of the projection 21 is ejected with the lump 23 fixedly holding the opening 24 of the base plate B as in riveting, as best shown in FIG. 9.

Since parts of the cavity existed around the edge of the opening 26, the opening 22 is provided with the synthetic resin frame 25 when ejected from the mold, thus forming a smaller opening 22, which must be formed with an accuracy so as to receive the above described head portion 26 therein.

Although it is possible to obtain the opening 22 without forming any frame therearound, by preliminarily forming an opening 22' (not shown) in the metallic plate B (the opening 22' is an imaginary opening formed in the base plate B and substantially equal to the opening 22), the projection 29 must fit exactly in the opening 22' for preventing any molten synthetic resin to flow between the opening 22' and the projection 29, in which case the size of the projection 29 must be finished with accuracy, as well as the opening 22'.

In other words, in order to prevent the synthetic resin to flow therethrough, the size of the projection 29 on the molding block $M_2$ must be formed with accuracy as well as the opening 22', and yet the insertion of the projection 29 may be carried out with much difficulty.

On the other hand, according to the present invention, the opening 22 can be formed precisely in the predetermined size by the frame 25 in the step of molding, at the position around the edge of the previously prepared opening 22 in the metallic base plate B. In this case, the opening 22 is required at least to be large enough for enabling the projection 29 to pass therethrough, and furthermore the positioning of the opening 22 exactly in the predetermined position can be easily effected by the maintenance of the base plate B between the molding blocks $M_1$ and $M_2$, which maintenance can be ensured without difficulty.

Therefore, according to the present invention, the supporting projection 29 can readily be provided on the metallic base plate B in the molding process for molding the projection 21, and still the opening 22 for receiving the head portion can also be formed with accuracy during the molding process.

ITEM 2

Referring to FIG. 12, there is shown a completed piece of the molded projection P, namely a leaf spring 31 installed on the metallic base plate B at one end portion 32 thereof, while the other end portion 33 thereof extended to cover part of an rectangular opening 34 formed on the base plate B. The end portion 33 partly crosses over the opening 34 which is provided for receiving an arm means 35 extending from another base plate B' positioned below the former base plate B in parallel relation to each other. The arm means 35 is normally urged towards one direction so that the arm means 35 can be maintained in one operating position, which position will actuated one of the mechanism contained therein. Since the present invention is not directed to the mechanism, detailed description of the operation of the arm means 35 with the leaf spring 31 is omitted.

In order to form such leaf spring 31 on the base plate B, with one end portion 33 partly crossing over the opening 34, the base plate B is preliminarily formed with openings 34 and 36 as most clearly seen in FIG. 13. At least the opening 34 is formed by a process of blanking, so that a blanked out piece 37 can temporarily fill in the opening 34, as shown in FIG. 14. Then, the ase plate B with the blanked out piece temporarily held in the opening 34 is tightly held between the upper and lower molding blocks $M_1$ and $M_2$.

Referring now to FIG. 15, the upper molding block $M_1$ has a recess 38 which corresponds exactly with the configuration of the leaf spring 31, while the lower molding block $M_2$ has a shallow recess 39 formed below the opening 36 for forming a lump 40 of synthetic resin thereat. It should be noted that the size of the recess 39 is larger than that of the opening 36. The lower molding block $M_2$ is further formed with a groove 41 for forming a runner 42, with one end portion thereof connected to the recess 39 and the other end portion thereof (not shown) connected to one of the neighboring recess (not shown). After effecting the molding process in the manner as described above, the ejected piece, i.e., the leaf spring 31, is fixedly provided on the base plate B, because the lump 40 integrally connected with the leaf spring 31 through the opening 36 tightly engages the opening 36 due to the shrinkage of the synthetic resin in the opening 36.

Referring to FIGS. 16 and 17, the blanked out piece 37 is taken out from the opening 34 to have one end portion 33 of the leaf spring 31 partly crossing over the opening 34.

It should be noted that the leaf spring 31 described as partly crossing over the opening 34 can be replaced by any other projections which can be formed by molding, with respect to the mechanism to be employed in the device.

It should also be noted that the leaf spring 31 or any other projections describe as partly crossing over the opening 34 can be formed so as to completely cross over the opening 34.

It should further be noted that the opening 34 described as having a rectangular shape can be formed in any other configurations such as an elongated groove or a circle, depending on the type of constructing components or mechansim to be incorporated in the device.

Therefore, according to the present invention, the synthetic resin projection can be extended along the base plate to cross over the opening formed on the base plate without any difficulty.

ITEM 3

Figure 18:
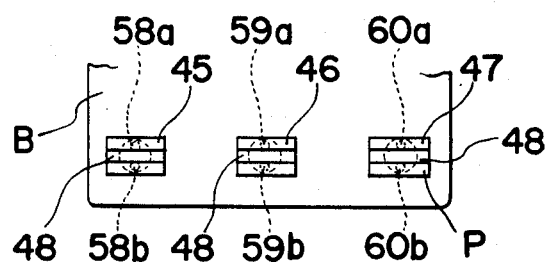
FIGS. 18 and 19 are fragmentary top and front views of a series of guiding blocks.
Figure 19:
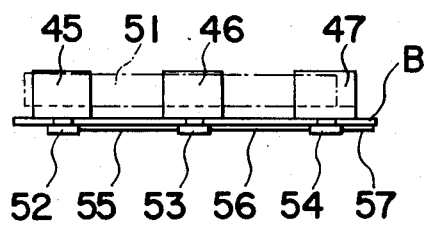

Referring to FIGS. 18 and 19, there is shown completed pieces of the molded projection P, namely a series of three guiding blocks 45, 46 and 47 fixedly mounted on the base plate B.

Figure 20:
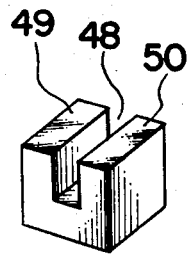
FIG. 20 is a perspective view of one of the series of guiding blocks.

Referring to FIG. 20, each of the U-shaped guiding blocks has a groove 48 formed by two side projections 49 and 50. These three U-shaped guiding blocks 45, 46 and 47 are arranged in a straight row, spaced in a predetermined pitch from each other, in such a manner that respective grooves 48 of these three U-shaped blocks are in alignment with each other, so that these grooves 48 may serve to slidingly support the strip-like sliding member 51 thereon for actuating one of the mechanism (not shown) employed in the device. These three U-shaped guiding blocks 45, 46 and 47 are fixedly installed on the base plate B by lumps 52, 53 and 54 formed immediately below the base plate B, respectively at positions opposing the guiding blocks 45, 46 and 47. These lumps 52, 53 and 54 are connected to each other by runners 55 and 56.

It should be noted that one of the lumps 52, 53 and 54, for instance, in this case the lump 54, is further connected with a runner 57 which leads to one of neighboring lump (not shown).

Figure 21:
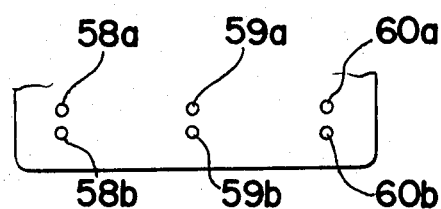
FIG. 21 is a fragmentary top plane view of the base plate for forming thereon a series of guiding blocks, shown in FIGS. 18 and 19.

In order to form such series of guiding blocks 45, 46 and 47 fixedly on the base plate B, the metallic base plate B is preliminarily formed with pairs of openings 58a, 58b, 59a, 59b, 60a and 60b and shown in FIG. 21. Each of the pairs is located at corresponding position with each of the guiding blocks to be positioned. Then the metallic base plate B is held between the upper and lower molding blocks $M_1$ and $M_2$.

Figure 22:
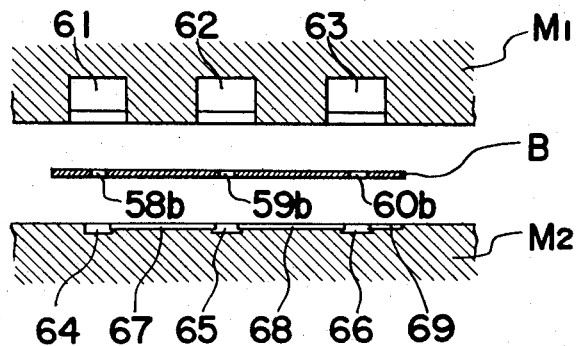
FIG. 22 is a fragmentary side sectional view showing the relation between base plate and the upper and lower molding blocks, for forming the series of guiding blocks.

Referring to FIG. 22 the upper molding block $M_1$ has three recesses 61, 62 and 63 in alignment with each other, wherein each of the recesses corresponds with the configuration of the guiding block. The lower molding block $M_2$ has three shallow recesses 64, 65 and 66 in corresponding position with the three recesses in the upper molding block for forming the lumps 52, 53 and 54 of synthetic resin thereat. It should be noted that each of the shallow recess formed in the lower molding block $M_2$ has the size large enough to cover the pair of openings formed in the base plate B.

In addition to three shallow recesses the lower molding block $M_2$ has two grooves 67 and 68 for connecting the three shallow recesses, and one groove 69 extending from one of the shallow recess, for instance, in this case the shallow recess 66, towards one of the neighboring recess (not shown) for another projection.

When these upper and lower molding blocks $M_1$ and $M_2$ tightly hold the base plate B therebetween a cavity is formed around each of the pairs of openings, while each cavity is connected by the grooves 67 and 68. Then it is ready for molding.

After effecting the molding process in the same manner as described above, the ejected pieces, i.e., the series of guiding blocks 45, 46 and 47 are fixedly provided on the base plate, because each of the lumps 52, 53 and 54 integrally connected to each of the guiding blocks 45, 46 and 47 through the pair of openings 58a, 58b, 59a, 59b, 60a and 60b, tightly engages the base plate B, due to the shrinking of synthetic resin in the pair of openings.

Figure 23:
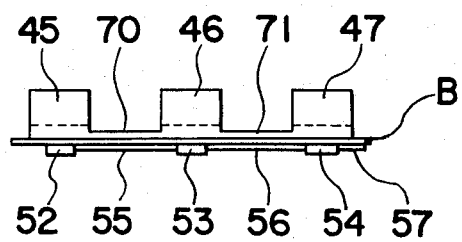
FIG. 23 is a similar view to FIG. 19, but particularly shows a modification thereof.

It should be noted that the series of guiding blocks mentioned above as formed separately on the base plate B can be further formed with comparatively thin-gauged connecting member 70 and 71 in the spaces formed between the three guiding blocks for connecting each of the guiding blocks integrally, as shown in FIG. 23.

It should also be noted that the series of guiding blocks mentioned above as consisting of three separate guiding blocks can be consisting of more than three, or even two.

Since the relative positioning of the guiding blocks 45, 46 and 47 is exactly determined by the recesses 61, 62 and 63 formed in the upper molding block, it is not necessary to adjust each of the guiding blocks 45, 46 and 47 in its predetermined position after having been ejected from the mold, provided that the recesses 61, 62 and 63 are preliminarily formed with accuracy.

Figure 24:
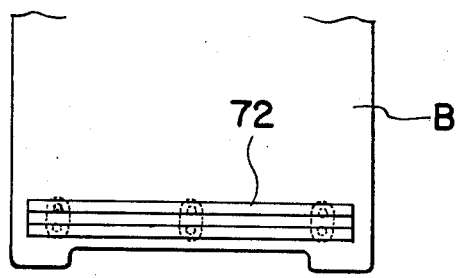
FIGS. 24 and 25 are fragmentary explanatory diagrams for the series of guiding blocks shown in FIGS. 18 to 23.
Figure 25:
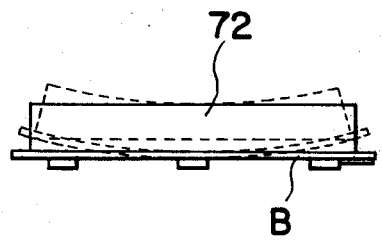

Although it is possible to form the guiding blocks in one integral elongated body 72, as shown in FIG. 24, such guiding block is only suitable for the guiding blocks in small sizes, which do not need to take the shrinkage of the synthetic resin in consideration. However, when the size of the guiding block becomes comparatively large, the shrinkage of synthetic resin may cause the metallic base plate B to curve inwardly together with the guiding block through a plurality of engaged points between the guiding block and the base plate, as shown in FIG. 25. Thus, it is preferable to form the guiding blocks in several pieces.

Therefore, according to the present invention, the elongated groove formed by the guiding blocks can be maintained with accuracy, because the shrinking degree of synthetic resin of each guiding block is not so large as to deform the configuration of the guiding block, and also the relative positioning between the blocks is precisely defined by the molding blocks which are preliminarily prepared with accuracy.

ITEM 4

Referring to FIGS. 34 to 37, there is shown a completed piece of the molded projection P, which is the modification of the series of guiding blocks 45, 46, and 47 described in the Item 3. Instead of the three separate guiding blocks described as employed in the series of guiding blocks in Item 3, the series of guiding blocks in this Item 4 are composed of eight pieces of upright blocks.

Before going into the detailed description for the series of eight guiding blocks shown in FIGS. 34 to 37, first, the series of six guiding blocks is described in connection with FIGS. 26 to 33, for its more fundamental construction.

Figure 26:
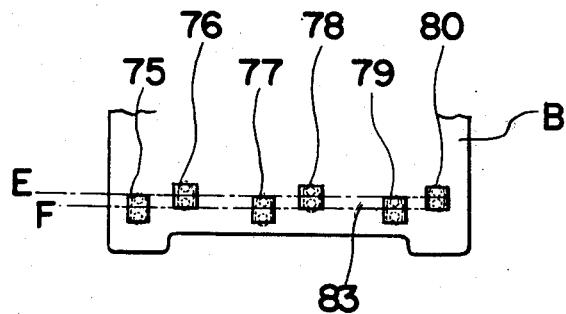
FIGS. 26 and 27 are similar views to FIGS. 18 and 19, but particularly show a modification thereof.
Figure 27:
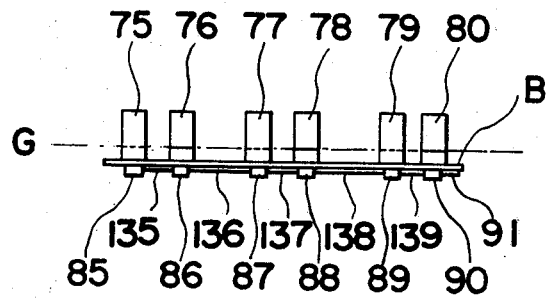

Referring to FIGS. 26 to 27, there is shown the series of guiding blocks which are composed of six pieces of L-shaped blocks 75, 76, 77, 78, 79 and 80. Each of the L-shaped blocks has a seating surface 81 and an upright surface 82, as best shown in FIG. 29.

A first group of three of the six L-shaped blocks 76, 78 and 80 are arranged in a straight row, spaced a predetermined pitch from each other, in such a manner that respective upright faces 82 of these three L-shaped blocks 76, 78 and 80 of said first group face in the same direction and lay on the same imaginary plane E perpendicular to the base plate B. On the other hand, a second group of the rest of the six L-shaped blocks 75, 77, and 79 are arranged in a substantially similar manner to those of said first group, but have their upright faces 82 facing in the direction opposed to the facing direction of those of the first group and lay on the same imaginary plane F which is spaced in parallel relation to said first mentioned imaginary plane E. These first and second groups of the L-shaped blocks are oppositely displaced a distance approximately equal to half the pitch in the direction of the straight row of any of said first and second groups. The seating surfaces 81 of the L-shaped blocks of the first and second groups are disposed in a space defined between the two imaginary planes E and F, laying on the imaginary plane G perpendicular to any of said two imaginary planes E and F and parallel to the plane of the base plate, and upwardly oriented in a direction opposite to the base plate B.

Therefore, the space defined by the imaginary planes E, F and G form an elongated groove 83 while the upright surface 82 and seating surfaces 81 of the blocks of the first and second groups serve to alternately support the strip-like slidable plate member 84 thereon as described in connection with Item 3.

Positioned under the L-shaped blocks 75, 76, 77, 78, 79, and 80 are respectively lumps 85, 86, 87, 88, 89 and 90 of synthetic resin, integrally formed with each of the L-shaped blocks through a pair of opening formed in the base plate. The size of each lump is larger than that of the pair of openings, so that each L-shaped block is fixedly installed on the base plate B. It should be noted that these lumps 85, 86, 87, 88, 89 and 90 are connected to each other by runners 135, 136, 137, 138 and 139, and also the lump 90 is further connected to the neighboring lump (not shown) by a runner 91.

In order to form such series of guiding blocks 75 to 80, the metallic base plate B is preliminarily formed with pairs of openings 92, 93, 94, 95, 96 and 97 at corresponding positions with each of the L-shaped blocks 75, 76, 77, 78, 79 and 80 as shown in FIG. 30. Then, the base plate B is tightly held between upper and lower molding blocks $M_1$ and $M_2$, as best shown in FIG. 31. The upper molding block $M_1$ has recesses 98, 99, 100, 101, 102 and 103 with the shape thereof corresponding with the configuration of the series of the L-shaped blocks, while the lower molding block $M_2$ has shallow recesses 104, 105, 106, 107 108 and 109 with the shape thereof corresponding with those of the lumps to be formed under each of the L-shaped blocks. The lower molding block $M_2$ is further provided with grooves 110, 111, 112, 113 and 114 which connect each of the shallow recesses, and also one of the shallow recesses, in this case the shallow recess 109, is provided with a groove 115 which connects one of the neighboring shallow recesses (not shown) for the pass of synthetic resin.

After effecting the molding process in the same manner as described above, the ejected pieces, i.e., the series of L-shaped guiding blocks are fixedly provided on the base plate B, because each of the lumps 85 to 90 being integrally connected to each of the L-shaped guiding blocks through the pair of openings 92 to 97, tightly engages the base plate B due to the shrinkage of synthetic resin in the openings.

It should be noted that the L-shaped blocks described as composed of six pieces can be composed of any number of pieces more than three.

Referring to FIG. 33, there is shown a modification of the series of guiding blocks. In this embodiment, either one of the two groups described as being composed of three pieces of the L-shaped guiding blocks, for example, the three L-shaped blocks 75, 77 and 79 in the second group can be replaced by three pieces of blocks 116, 117 and 118 each having a configuration of rectangular parallelpiped block, wherein one of the surface is laid on the imaginary plane F and yet the effect is the same as in the former embodiment.

It should be noted that the series of guiding blocks described as composed of L-shaped blocks, can all be composed blocks having a configuration of rectangularly parallelpiped block, wherein the blocks in the first and second groups have their one surface being laid on the imaginary plane E and F, respectively, while the imaginary surface G is defined by the surface of the base plate B, thus the plate member is supported directly on the base plate B. In this case, the blocks in the first and second groups can either be arranged in above described manner or in such a manner to have the surfaces defining the imaginary surfaces E and F in directly opposing positions.

Figure 34:
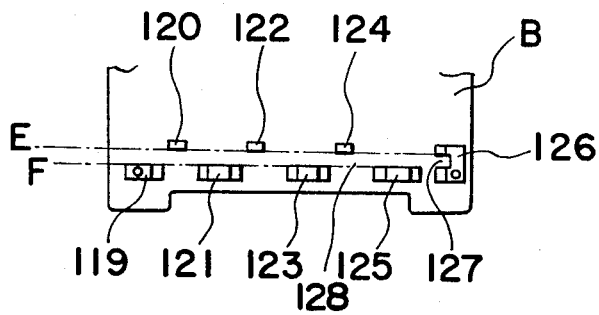
FIGS. 34 to 36 are similar views to FIGS. 26 to 28, but particularly show a modification thereof.
Figure 35:
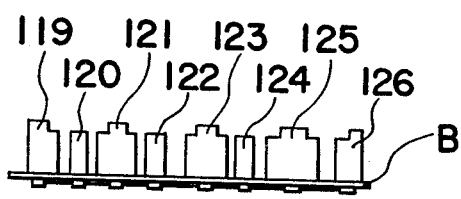
Figure 36:
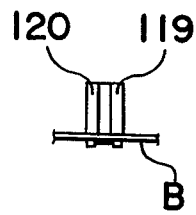

Referring now to FIGS. 34 to 36, the series of eight guiding blocks are composed of seven blocks 119 to 125, alternately disposed on the imaginary surfaces F and E, and an end block 126 disposed adjacent to the block 125. The end block 126 is formed with cut off portion 127 in which the imaginary plane E and F terminates their edges.

Therefore, the space defined by the imaginary planes E, F and the surface of the base plate B form and elongated groove 128, while the cut off portion 127 defines the end of the groove 128. In this groove 128, the slidable plate mamber 84 can be reciprocally supported, as described above.

Figure 37:
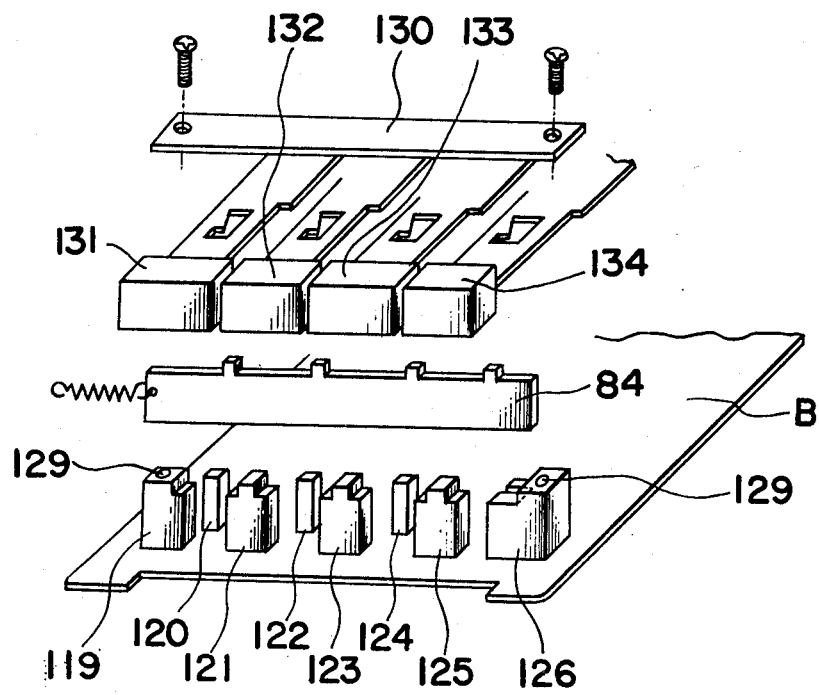
FIG. 37 is an exploded view of the guiding blocks shown in FIGS. 34 to 36, showing a part of mechanism to be coupled with the guiding blocks.

Referring to FIG. 37, the block 119 and the end block 127 are formed with a screw hole 129 at top surface thereof for rigidly securing a plate 130 over the groove 128. After placing the slidable plate member 84 coupled with push buttons 131, 132, 133 and 134 into the groove 128, the plate 130 covers over the groove 128 for preventing the slidable plate member 84 from being thrown out from the groove 128.

These series of guiding blocks is suitable especially for supporting sliding plate member with wide width.

Assuming if the series of U-shaped guiding blocks described in Item 3 were to support such a plate member having wide width, each of the U-shaped blocks have to be prepared with comparatively high side projections, for preventing the plate member to fall over from the groove. However, such a U-shaped guiding block with high side projection results in comparatively great degree of shrinkage, which will deform the configuration of the U-shaped block in such a manner that the side projection thereof may curve inwardly toward each other, as shown in FIG. 32. Therefore, the side projections may not keep the space between the side projection for supporting the plate member in even width along the side projection.

On the other hand, according to the guiding blocks in Item 4, the space for supporting the plate member is defined by the upright surface of the each L-shaped block. Since these L-shaped blocks are formed individually, the shrinkage takes place in a direction along the upright surface. Therefore, according to the guiding blocks of the present invention, the space for supporting the plate member is maintained evenly along the upright surface.

ITEM 5

Figure 38:
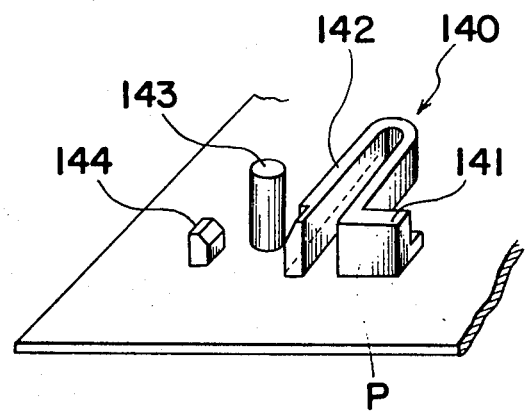
FIG. 38 is a fragmentary perspective view of a U-shaped leaf spring together with accessory parts therefor installed on the base plate.

Referring to FIG. 38, there is shown a completed piece of the molded projection namely a U-shaped leaf spring 140 with accessory parts which are fixedly provided on the metallic base plate B. One end portion 141 of the U-shaped leaf spring 140 is fixedly provided on the base plate B, while the other end portion 142 of the U-shaped leaf spring 140 is free from the base plate B, thus urging towards one of the component contained in the device. Adjacent to the free end portion 142 of the U-shaped leaf spring 140 is a pin projection 143 for receiving said one of the components thereon, and adjacent to the pin projection is an engaging projection 144.

Figure 39:
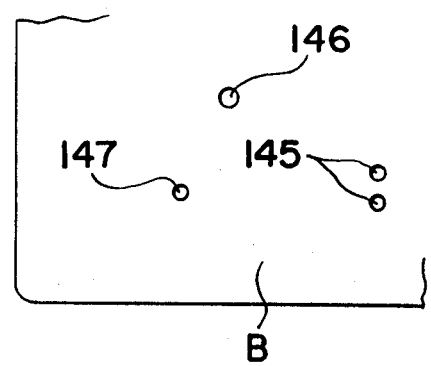
FIG. 39 is a fragmentary top plane view of the base plate showing openings for forming the U-shaped leaf spring and accessory parts therefor.
Figure 40:
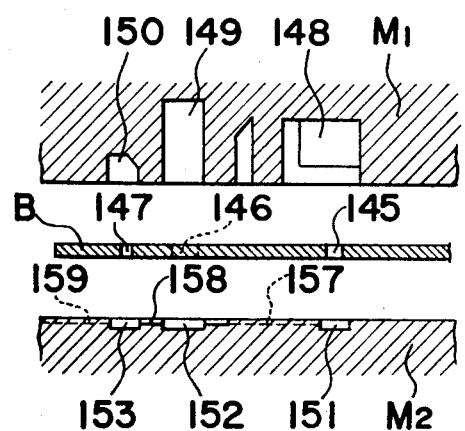
FIG. 40 is a fragmentary side sectional view showing the relation between the base plate and the upper and lower molding blocks for forming the U-shaped leaf spring and accessory parts therefor.
Figure 41:
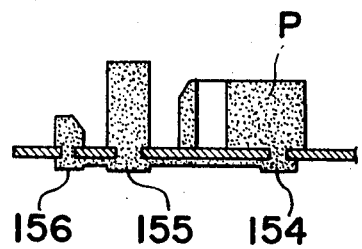
FIG. 41 is a schematic sectional view of the ejected U-shaped leaf spring and accessory parts therefor.

In order to form such projections, the metallic base plate B is preliminarily formed with openings 145, 146 and 147, as shown in FIG. 39. Then, the metallic base plate B is tightly held between the upper and lower molding blocks $M_1$ and $M_2$, as shown in FIG. 40. The upper molding block $M_1$ has three recesses 148, 149 and 150, which correspond with the configuration of the U-shaped leaf spring 140, the pin projection 143, and the engaging projection 144. On the other hand, the lower molding block $M_2$ has three shallow recesses 151, 152 and 153, formed immediately below the openings 145, 146 and 147, for forming lumps 154, 155 and 156 of synthetic resin thereat as best shown in FIG. 41. It should be noted that the size of the shallow recesses 151, 152 and 153 are larger than that of the openings 145, 146 and 147, respectively. The lower molding block $M_1$ is further formed with a grooves 157, 158 and 159 extending from the shallow recess 152. The grooves 157 and 158 are connected to the shallow recesses 151 and 153, while the groove 159 is connected to one of the neighboring shallow recess (not shown). After effecting the molding process as in the manner described above, the ejected piece, i.e., the U-shaped leaf spring 140 with accessory parts, are fixedly provided on the metallic plate B, in the predetermined positions, and are ready for use, because the lumps 154, 155 and 156 being integrally connected with the projections through the openings 145, 146 and 147 tightly engages with the openings due to the shrinkage of synthetic resin in the opening.

Figure 42:
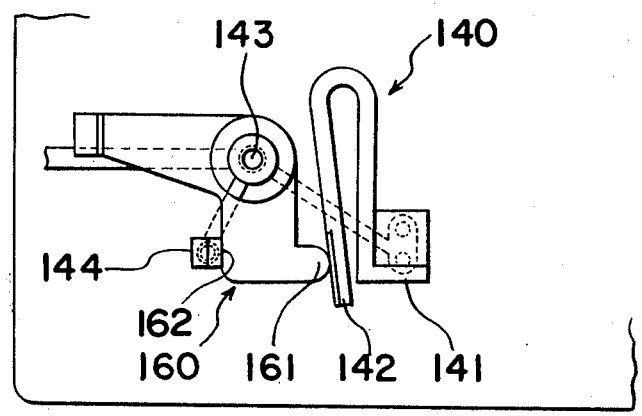
FIG. 42 is a fragmentary top plan view of the U-shaped leaf spring and accessory parts therefor showing a part of mechanism coupled therewith.

Since the U-shaped spring 140 is fixedly held at one end portion 141, the other end portion 142 thereof may serve as a spring means effecting on one of the components in the device, for example, a lever 160, as shown in FIG. 42.

Referring to FIG. 42, the lever 160 is rotatably mounted on the pin projection 143 and also displacably along the pin projection 143. Normally, one corner portion 161 of the lever 160 is in contact with the U-shaped spring 140 at the end portion 142, while the another corner portion 162 is engaged with the engaging projection 144, thus maintaining the position of the lever 160 between the U-shaped leaf spring 140 and the engaging projection 144. Upon receipt of a suitable external force, the lever 160 is shifted upwardly for a suitable distance to disengage from the engaging projection 144, whereby the lever 160 is rotated about the pin projection 143 in the clockwise direction for some degrees by the urging force of the leaf spring 140 so that the lever 160 may be positioned in one operating position. On the other hand, another suitable external force may return the lever 160 in its normer engaged position.

It should be noted that the finished pieces, i.e., the U-shaped leaf spring 140 described as obtained after the molding process can be formed in any desirable configuration, since synthetic resin can be formed into any desirable shapes according to the configuration of the mold. For example, the end portion 142 of the leaf spring 140 can be formed in a form of taper, as well as the engaging projection 144, as most clearly seen in FIG. 41.

It should also be noted that the leaf spring 140 described as employed with a configuration of U-shape, other shapes of the leaf spring are available, for example a leaf spring with a configuration of plain sheet can be employed.

Therefore, according to the present invention, the synthetic resin projection can be molded as the spring means by utilizing the elastic force of the synthetic resin.

ITEM 6

Figure 43:
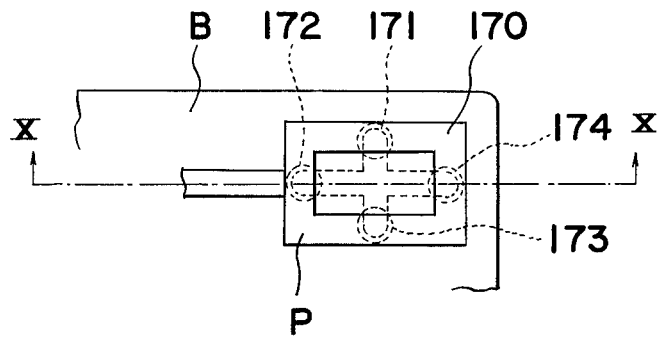
FIG. 43 is a fragmentary top plan view of a case projection.
Figure 44:
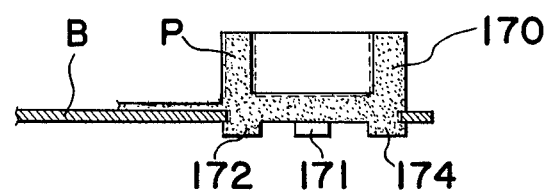
FIG. 44 is a cross sectional view taken along the line X—X of FIG. 43.

Referring to FIGS. 43 and 44, there is shown a completed piece of the molded projection P, namely a case projection 170, being fixedly installed on the base plate B. Under the base plate B are four lumps 171, 172, 173 and 174 of synthetic resin positioned immediately below the center of the each side of the box-like case projection 170.

Figure 45:
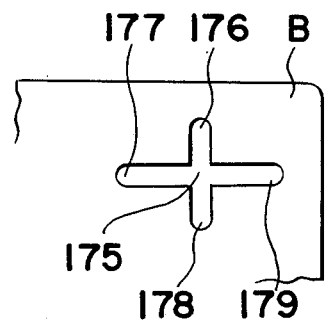
FIG. 45 is a fragmentary top plan view of the base plate showing an opening for forming the case projection shown in FIG. 43.
Figure 46:
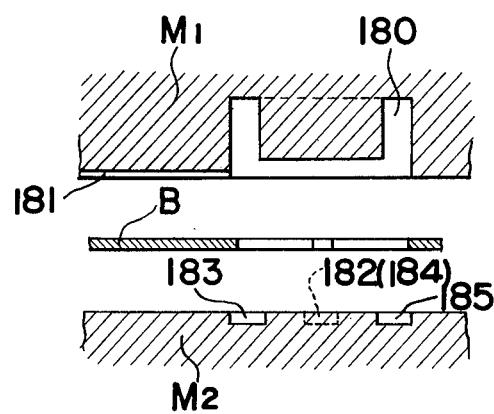
FIG. 46 is a side sectional view showing the relation between the base plate and the upper and lower molding blocks for forming the case projection shown in FIG. 43.

In order to form such case projection, the base plate B is previously formed with an opening 175 having four branches 176, 177, 178 and 179 in the form of the cross, as shown in FIG. 45, which is substantially equal to the cross formed by connecting the opposing lump, i.e., the lump 171 with the lump 173, and the lump 172 with the lump 174. It should be noted that the width of the each branch in the cross is not wider than the diameter of the each lump. Then, the base plate B is tightly held between the upper and lower molding blocks $M_1$ and $M_2$ as best shown in FIG. 46. The upper molding block $M_1$ has a recess 180 which corresponds with the configuration of the case projection 170 and a groove 181 extending from said recess towards the one of the neighboring recess (not shown). On the other hand, the lower molding block $M_2$ has four shallow recesses 182, 183, 184 and 185 which correspond with the lumps 171, 172, 173 and 174. After effecting the molding process in the same manner as described above, the ejected piece, i.e., the case projection 170, is fixedly provided on the base plate B, because the lumps 171, 172, 173 and 174 being integrally connected with the case projection 170 through the opening 175 tightly engages with the opening 175 due to the shrinkage of the synthetic resin in the openings.

The reason for forming the cross opening in the base plate is that the lumps 171, 172, 173 and 174 formed at the ends of the cross may shift along the branches 176, 177, 178 and 179 of the opening towards the center portion thereof when shrinking proceeds in the case projection 170, and yet still the lumps tightly holding the base plate.

Figure 47:
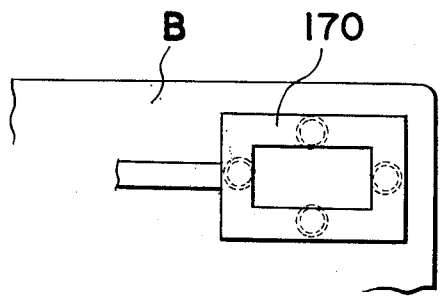
FIGS. 47 and 48 are explanatory diagrams for the case projection shown in FIG. 43.
Figure 48:
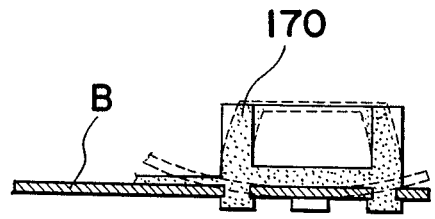

If there were no cross in the base plate B, but only four openings at the ends of the cross, as shown in FIG. 47, the lumps may not allow the base portion of the case projection 170 to shrink, while the upper rim portion of the case projection may shrink inwardly so that the case projection itself becomes deformed in the shape of frustum of a square pyramid, as shown in FIG. 48.

Therefore, the case projection 170 formed on the opening 175 in the shape of the cross is especially suitable for those case projections which requires high accuracy in their sizes.

It should be noted that the case projection 170 described as formed on the crossing opening 175 can be replaced by any other type of projection which are formed by large mass of synthetic resin.

It should also be noted that the opening 175 described as formed in the shape of cross is not limited to the cross with four branches 176, 177, 178 and 179 but the crosses the more than four branches can be employed, or the branches in the shape of 'Y' can be employed, as long as the branches may be extended in the direction of the radial directions from the center of the opening, and if possible, it is better to make the center of the opening coincide with the center of the base of the molded synthetic resin piece.

ITEM 7

Figure 49:
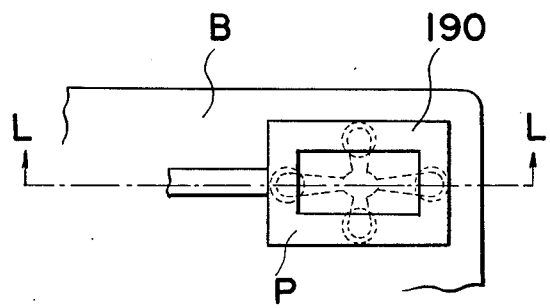
FIG. 49 is a similar view to FIG. 43, but particularly shows a modification thereof.
Figure 50:
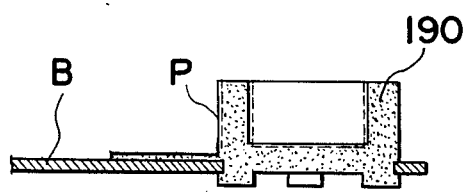
FIG. 50 is a cross sectional view taken along the line L—L of FIG. 49.

Referring to FIGS. 49 and 50, there is shown a completed piece of the molded projection P, which has the same configuration as that of the case projection 170 described in the Item 6. However the case projection 190 in this Item 7 is molded on different shape of opening formed in the base plate B. Since the configuration of the case projection 190 and the recesses to be formed in the upper and lower molding blocks are exactly same as those described in the Item 6, the detail explanation therefor is omitted. Therefore, in this Item 7, the description is mainly directed to the opening to be formed in the base plate B.

Figure 51:
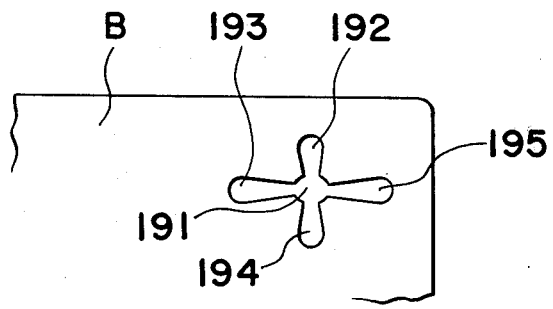
FIG. 51 is a similar view to FIG. 45, but particularly shows a modification thereof.

Referring to FIG. 51, there is shown an opening 191 having four branches 192, 193, 194 and 195 to be formed in the base plate B. Although this opening 191 too has the form of cross, each branch of the four branches has not the width in the same size through out the branches as in the branches in the Item 6, but has the width of the branches growing larger towards the end of the branches.

It should be noted that the width at the end of the each branch is not as large as the width if the lumps to be formed thereat, even if the width of the branches gro large towards the end.

Figure 52:
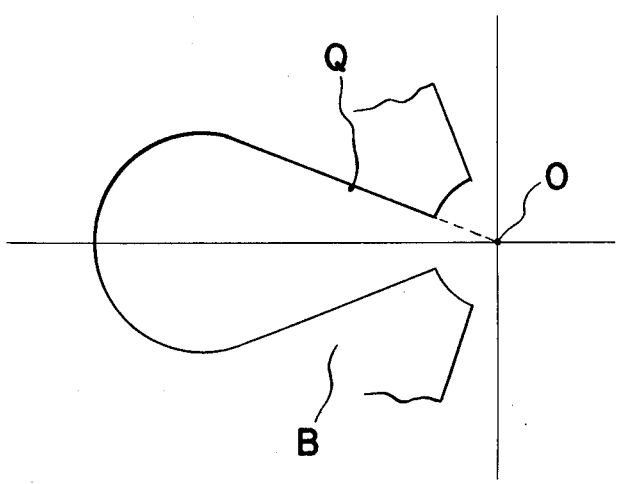
FIG. 52 is a similar view to FIG. 51, but particularly shows a detailed construction thereof in an enlarged scale.

Referring to FIG. 52, there is shown one of the branch of the opening in the enlarged scale. The edge of the branch extends along on the line radially extending from the geometrical center point 0, in other words, the edge of the opening itself directs towards geometrical center point 0. As in the same manner, all the other edges forming the opening directs towards the geometrical center point 0.

Since the molten synthetic resin filled in the opening 191 tends to shrink towards the geometrical center point 0, an particle of the molten synthetic resin positioned at Q also tends to shrink towards the geometrical center point 0, in other words shrinks along the edge thereof. Therefore, the molted synthetic resin filled in the opening 191 fittingly shrink along the opening without producing any space between the edge of the synthetic resin and the edge of the opening, nor producing any intolerable force on the base plate to such an extent as to deform the base plate.

It should be noted that the projection described as formed on the crossing opening can be replaced by any other type of projection which are formed by large mass of synthetic resin.

It should also be noted that the opening described as formed in the shape of cross in not limited to the cross with four branches but the crosses with more than four branches are available, as long as the branches extend in the direction of the radial directions with their edges coinciding with the line radially extending from the geometrical center point of the opening, and if possible, it is more preferable to make the center the said geometrical center point coincide with the center point of the base of the molded synthetic resin piece.

Therefore, according to the present invention, it is possible to form the synthetic resin projection of large sizes, without having such trouble as to deform the configuration of the projection or cause the base plate to curve inwardly, due to the shrinkage of the synthetic resin, because the shrinking force of the synthetic resin is totaly absorbed within the projection itself.

ITEM 8

Before going into the detailed description for the Item 8, it is to be noted that the descriptions up to the Item 7 have been directed to each of the projections on the base plate, while the descriptions in the Items from 8 to 14 are directed to the runners connecting two projections. Although there is no problem in the runners whose shrinkage hardly effects the base plate or the projections except for merely connecting two of the neighboring projections, there are such problems on those runners which connect two projections spaced from each other by a comparatively large distance, as described hereinbelow.

Figure 57:
FIG. 57 is a diagram explanatory of the runner connecting the two boss projections.

First, when the runners are comparatively long, the shrinkage of the runners especially in the longitudinal direction thereof may effect the base plate to curve inwardly with respect to the degree of the shrinkage of the runners, as shown in FIG. 57.

Figure 75:
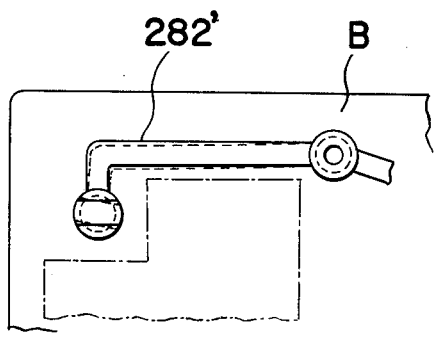
FIG. 75 is a diagram explanatory of the L-shaped runner shown in FIGS. 70 and 72.

Secondly, when the runners are comparatively long, the shrinkage thereof cause the connecting two projections to tilt inwardly towards each other, or otherwise to rotate the projection undesirably if the runners are extended in L-shape, as shown in FIG. 75.

Figure 79:
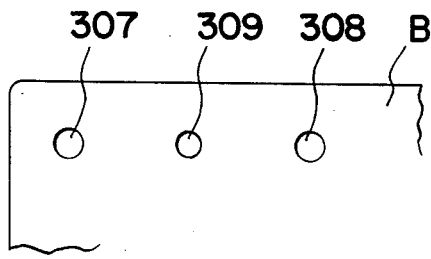
FIG. 79 is a fragmentary top plan view of the base plate showing openings for forming the two boss projections and the runner shown in FIG. 76.

Thirdly, when the runners are comparatively long, such runners may hinder other projections to be installed between the two projections being connected by the runners, as shown in FIG. 79.

In order to solve these problems, such runners described in the Items from 8 to 14 are presented.

Now, it should be noted that the runner formed by a groove which is formed in the molding block between recesses for allowing molten synthetic resin to flow therethrough may be cleared away from the framework after being ejected from the mold, but such a clearing away process results in increase in the manufacturing cost for manufacturing the framework.

Figure 53:
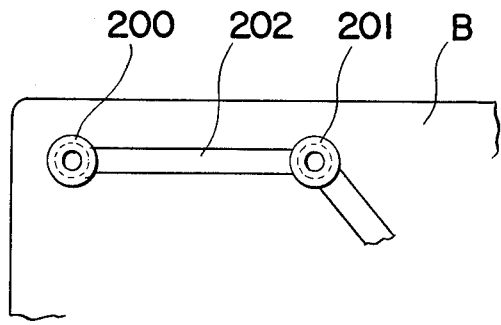
FIGS. 53 and 54 are fragmentary top and front views of runners connecting two boss projections.
Figure 54:
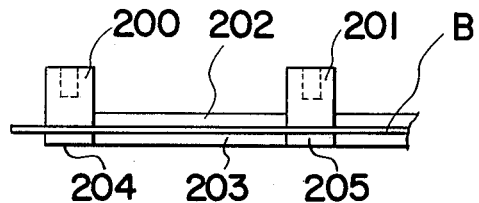
Figure 55:
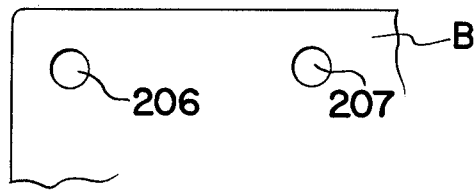
FIG. 55 is a fragmentary top plan view of the base plate showing openings for forming the boss projections shown in FIGS. 53 and 54.
Figure 56:
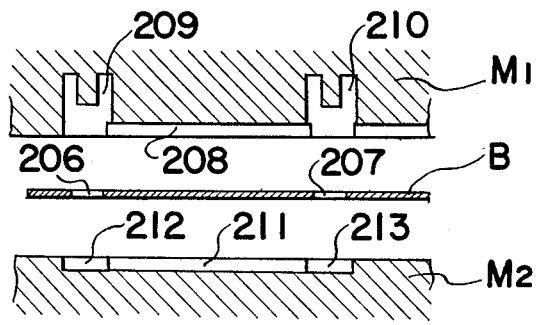
FIG. 56 is a fragmentary side sectional view showing the relation between the base plate and the upper and lower molding blocks for forming the boss projections together with the runners shown in FIGS. 53 and 54.

Referring to FIGS. 53 and 54, there are shown completed pieces of two boss projections 200 and 201, being connected to ech other with runners 202 and 203 provided on both side of the base plate B. Each of the two boss projections 200 and 201 is a cylindrical projection with a coaxial cylindrical recess on the top portion thereof, and is fixedly installed on the base plate B by lumps 204 and 205 formed immediately blow the base plate B at positions opposing the boss projections 200 and 201, respectively. The runner 202 connects the bottom portion of the boss projection 200 with the bottom portion of the boss projection 201 is straight form, while the runner 203 connects the lump 204 with the lump 205 is exactly the same form with the former runner 202. It is to be noted that at least one of the boss projections is connected to any one of the neighboring projection. In order to form such runners 202 and 203 between the two boss projections 200, and 201 the base plate B is preliminarily provided with two opening 206 and 207, as shown in FIG. 55. Then, the base plate B is sandwiched between upper and lower molding blocks $M_1$ and $M_2$, as shown in FIG. 56. The upper molding block $M_1$ is provided with a groove 208 which connects two recesses 209 and 210 for molding boss projections 200 and 201, while the lower molding block $M_2$ is formed with a groove 211 connecting two shallow recesses 212 and 213 for the lumps 204 and 205, respectively.

After effecting the molding process in the same manner as described above, the ejected runners 202 and 203 connects the boss projections 209 and 210 in the manner as described above.

Since the runners provided on both sides of the base plate B have exactly the same form the degree of the shrinkage taking place in the runners 202 and 203 is also exactly the same amount. Therefore, the shrinking force in the runner 202 has exactly the same amount of shrinking force in the runner 203, thus resulting in precise positioning of the projection.

Therefore, according to the present invention, the shrinking force of the runner 204 connecting the two boss projections do not effect the base plate, because said shrinking force of the runner 202 is relatively eliminated by the another runner 203 provided on the opposite side of the former runner 202.

ITEM 9

Figure 58:
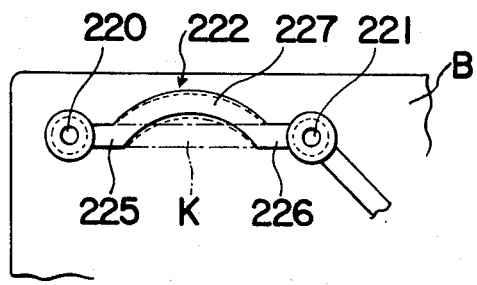
FIGS. 58 and 59 are fragmentary top and front views of a runner connecting two boss projections.
Figure 59:
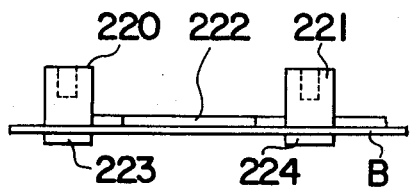

Referring to FIGS. 58 and 59, there is shown completed pieces of the two boss projections 220 and 221 being connected by a runner 222, provided between the two boss projections 220 and 221. Each of the two boss projections 220 and 221 are fixedly installed on the base plate B by lumps 223 and 224 formed immediately below the base plate B at positions opposing the boss projections 220 and 221, respectively. The two opposite end portions 225 and 226 of the runner 222 are laid on an imaginary straight bridge K, connecting the boss projections 220 and 221, while the intermediate portion 227 of the runner 222 is curved aside substantially in the form of arc from the imaginary straight bridge K on the base plate B.

Figure 60:
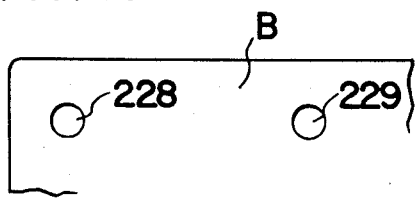
FIG. 60 is a fragmentary top plan view of the base plate showing opening for forming the boss projections shown in FIGS. 58 and 59.

In order to form such runner 222 desposed between the boss projections 220 and 221, the base plate B is preliminarily formed with two openings 228 and 229, as shown in FIG. 60. Then, the base plate B is sandwiched between the upper and lower molding blocks $M_1$ and $M_2$. The upper molding block $M_1$ is formed with groove 230 connecting two recesses 231 and 232 for the boss projections 220 and 221, while the lower molding block $M_2$ only has shallow recesses 233 and 234 for forming the lumps 223 and 224 thereat to hold the boss projection 220 and 221, respectively. The groove 230 in the upper molding block $M_1$ correspond with the shape of the runner 222.

After effecting the molding process in the same manner as described above, the ejected runner 222 may shrink for some degrees, in the process of cooling. However, since the runner 222 is not tensed between the two boss projections 220 and 221, the shrinking force of the runner do not affect the boss projections nor the base plate B. In other words, the shrinking force of the runner 222 is totally absorbed in the curved portion 227 of the runner 222, causing the curvature of the curved portion 227 to be stretched for some degrees with respect to the degrees of the shrinkage, as shown in dotted line in FIG. 58.

Figure 62:
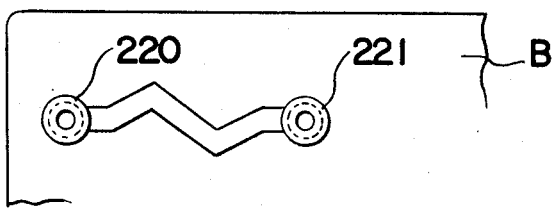
FIG. 62 is a similar view to FIG. 58, but particularly shows a modification thereof.

It should be noted that the intermediate portion 227 of the runner 222 described as formed in the shape of arc can be formed in any other form than the straight line, such as in the form of zigzag, as shown in FIG. 62, resulting in the same effect as described above.

It should be noted that the runner 242 described as formed on the upper surface of the base plate B can be formed on the lower surface of the base plate B.

Therefore, according to the present invention, the runner 222, connecting the two boss projections does not effect the base plate nor the boss projections by its shrinking force, because the wave or zigzag form of the runner absorbs its own shrinking force therein.

ITEM 10

Figure 63:
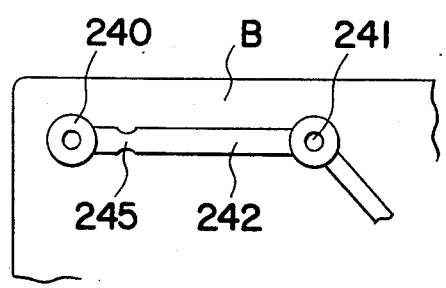
FIGS. 63 and 64 are similar view to FIGS. 58 and 59, but particularly show a modification thereof.
Figure 64:
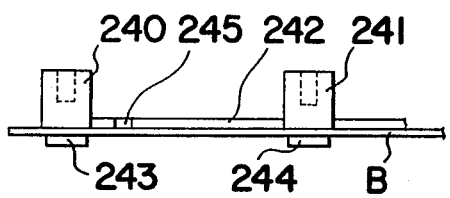

Referring to FIGS. 63 and 64, there is shown completed pieces of the two boss projections 240 and 241, being connected to each other with a runner 242 extended between the bottom of the boss projections 240 and 241, in straight form. Each of the two boss projections 240 and 241 are fixedly installed on the base plate B by lumps 243 and 244 formed immediately below the base plate B at position opposing the boss projections 240 and 241, respectively. The runner 242 has at least one narrowed portion 245 formed at intermediate portion thereof.

Figure 65:
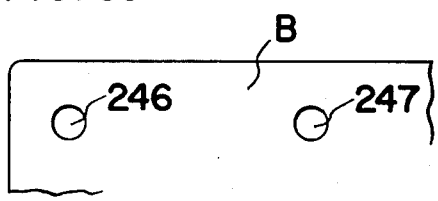
FIG. 65 is a fragmentary top plan view of the base plate showing openings for forming the boss projection shown in FIGS. 63 and 64.
Figure 61:
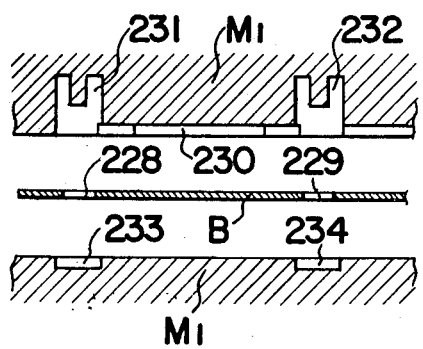
FIG. 61 is a fragmentary cross sectional view showing the relation between the base plate and the upper and lower molding blocks for forming the boss projections together with the runner shown in FIGS. 58 and 59.
Figure 66:
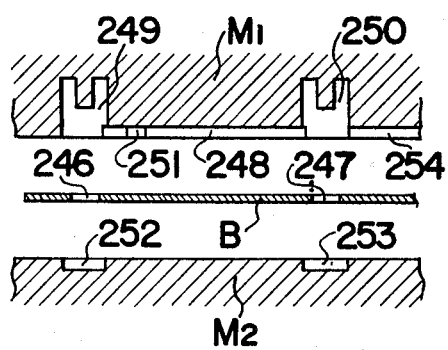
FIG. 66 is a fragmentary side sectional view showing the relation between the base plate and the upper and lower molding blocks for forming the boss projection together with the runner shown in FIGS. 63 and 64.

In order to form such runner 242 between the boss projections 240 and 241, the base plate B is preliminarily formed with two openings 246 and 247, as shown in FIG. 65. Then the base plate B is sandwiched between upper and lower molding blocks $M_1$ and $M_2$. The upper molding block $M_1$ is provided with a groove 248 connecting two recesses 249 and 250 which are prepared for molding the boss projections 240 and 241. The groove 248 has a narrowed portion 251 at corresponding narrowed portion 245 of the runner 242. On the other hand, the lower molding block $M_2$ only has shallow recesses 252 and 253 for forming the lumps 243 and 244 thereat to hold the boss projections 240 and 241, respectively. It should be noted that the recess 250 is connected to another groove 254 for allowing the molten synthetic resin therefrom into the recess 250 and further to the recess 249.

After effecting the molding process in the same manner as described above, the ejected runner 242 may shrink for some degrees, mostly in the longitudinal direction thereof, in the process of cooling.

Since the runner 242 has the narrowed portion 245 therein, such shrinking force in the runner 242 can be mostly absorbed in the narrowed portion 245, because the shrinking force is most likely to affect the narrowed portion 245 in such manner as to stretch the narrowed portion rather than to tilt the two boss projections 240 and 241 towards each other or bend the base plate B.

It should be noted that the narrowed portion 251 in the groove 248 is preferably to be formed at a position close to the recess 249, because in the process of molding, less amount of molten synthetic resin passes through the narrowed portion 251 in the groove 248, when compared with such a groove (not shown) which has the narrowed portion close to the recess 250, resulting in much amount of molten synthetic resin to pass through the narrowed portion.

It should also be noted that the runner 242 described as formed on the upper surface of the base plate B can be formed on the lower surface of the base plate B, and yet producing the same effect. In this case, the runner 242 is formed between the lumps 243 and 244.

Therefore, according to the present invention, the most of the shrinking force of the runner 242 causes the narrowed portion 245 to be stretched, thus scarecely affecting the base plate nor the boss projections so as to deform their configurations.

ITEM 11

Figure 67:
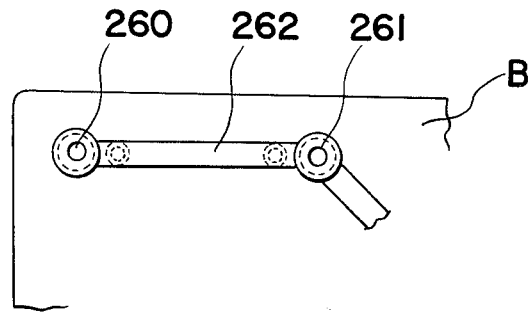
FIGS. 67 and 68 are similar views to FIGS. 58 and 59, but particularly show a modification thereof.
Figure 68:
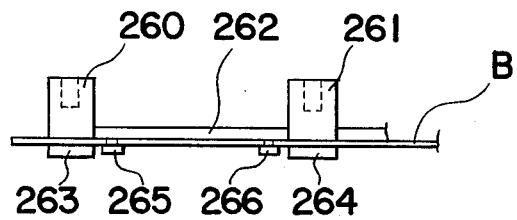

Referring to FIGS. 67 and 68, there is shown completed pieces of the two boss projections 260 and 261, being connected by a runner 262, stretched between the boss projections 260 and 261. Each of the two boss projections 260 and 261 are fixedly installed on the base plate B by lumps 263 and 264 formed immediately below the base plate B at positions opposing the boss projections 260 and 261, respectively. The runner 262 is also fixedly supported on the base plate B by lumps 265 and 266 formed immediately below the base plate B at positions adjacent to the lumps 263 and 264, and on the line connecting the lumps 263 and 264.

Figure 69:
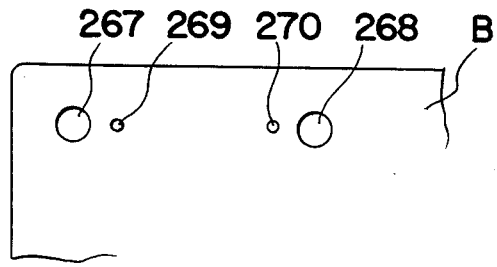
FIG. 69 is a fragmentary top plan view of the base plate showing openings for forming the two boss projections and runner shown in FIGS. 67 and 68.

In order to form such runner 262 connecting the boss projection 260 and 261, the base plate B is preliminary formed with openings 267, 268, 269 and 270. The larger openings 267 and 268 are prepared for integrally connecting the boss projections 260 and 261 with the lumps 263 and 264, respectively, while the smaller openings 269 and 270 are prepared for integrally connecting the runner 262 with the lumps 265 and 266. Then, the base plate B is sandwiched between the upper and lower molding blocks $M_1$ and $M_2$ as shown in FIG. 69. The upper molding block $M_1$ has two recesses 271 and 272 for molding the boss projections 260 and 261, and also has a groove 273 extending between the recesses 271 and 272. On the other hand, the lower molding block $M_2$ has four shallow recesses 274, 275, 276 and 277.

The shallow recesses 274 and 275 are for molding the lumps 263 and 264, respectively, while the shallow recesses 276 and 277 are for molding the lamps 265 and 266, respectively.

It should be noted that the recess 272 is further connected with another groove 278 for receiving the molten synthetic resin therefrom into the recess 272 and further to the recess 271.

After effecting the molding process in the same manner as described above, the ejected runner 262 may shrink to some degrees, mostly in the longitudinal direction thereof, in the process of cooling. Since the runner 262 is fixedly held on the base plate B by the lumps 265 and 266 integrally formed with the runner 262, the shrinking of the runner 262 mostly takes place in the runner portion defined by the two lumps 265 and 266. Therefore, the effect of the shrinking hardly affects the boss projections 260 and 261, thus the boss projections 260 and 261 can be maintained in the predetermined position even the runner portion between the two lumps 265 and 266 shrinks for some degrees.

It should be noted that the runner 262 described as formed integrally with the two lumps 265 and 266 can be formed with only one lump positioned approximately at the center portion of the runner 262, or more than two lumps with respect to the length of the runner 262 to be formed between the boss projections.

It should also be noted that the runner 242 described as formed on the upper surface of the base plate B can be formed on the lower surface of the base plate B.

Therefore, according to the present invention, the shrinking force of the runner 262 is mostly intercepted by the lumps 265 and 266, thus preventing said shrinking force from effecting on the boss projections.

ITEM 12

Figure 70:
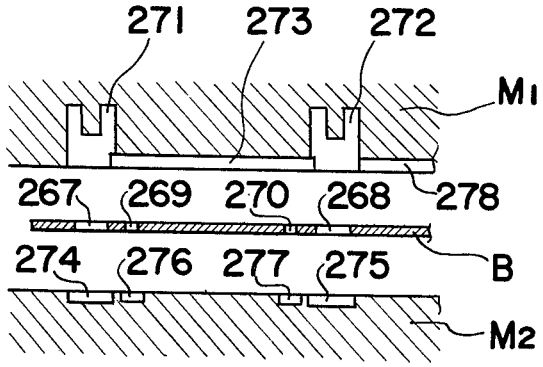
FIG. 70 is a fragmentary side sectional view showing the relation between the base plate and the upper and lower molding blocks for forming the boss projection together with the runner shown in FIGS. 67 and 68.
Figure 71:
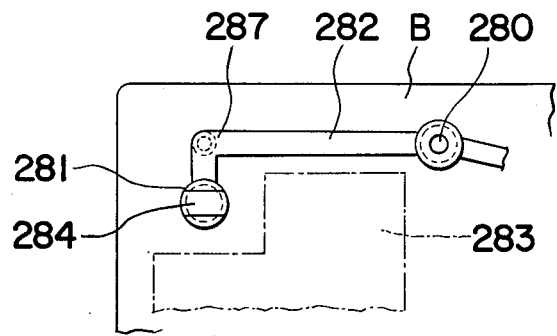
FIGS. 71 and 72 are fragmentary top and front views of a L-shaped runner connecting the boss projections.
Figure 72:
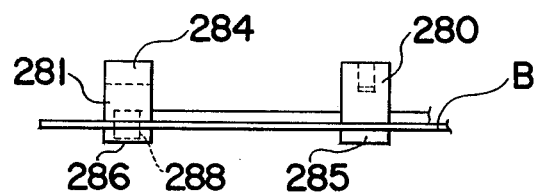
Figure 73:
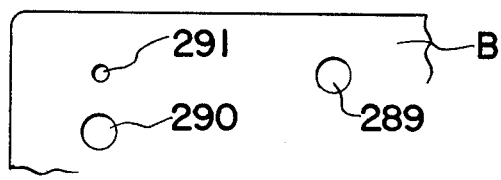
FIG. 73 is a fragmentary top plan view of the base plate showing openings for forming the two boss projections and the L-shaped runner shown in FIGS. 71 and 72.
Figure 74:
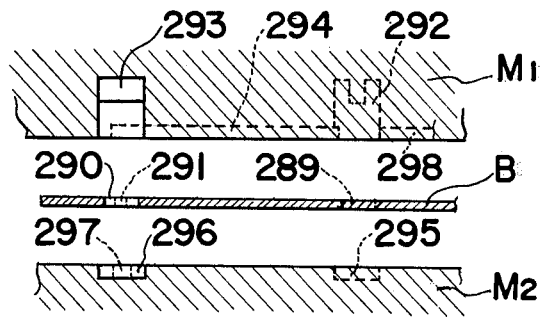
FIG. 74 is a fragmentary side sectional view showing the relation between the base plate and the upper and lower molding blocks for forming the boss projection together with the L-shaped runner shown in FIGS. 70 and 72.

Referring to FIGS. 70 and 71, there is shown completed pieces of the two boss projections 280 and 281, being connected by a L-shaped runner 282. It is necessary to form such L-shaped runner between the boss projections 280 and 281 when the space between the boss projection must be left open for installing one of the components 283 thereat. The boss projection 280 has exactly the same configuration as the boss projection described in Item 8. On the other hand, the boss projection 281 has a plate-like projection 284 formed on the top portion thereof, instead of the cylindrical recess. Each of the boss projections 280 and 281 are fixedly installed on the base plate B by lumps 285 and 286 formed immediately below the base plate B at positions opposing the boss projections 280 and 281, respectively. The L-shaped runner 282 has its corner portion 287 being fixedly installed on the base plate B by a lump 288 formed immediately below the base plate B at position opposing the corner portion 287.

In order to form such boss projections on the base plate B with the L-shaped runner 282 connecting these two boss projections 280 and 281, the base plate B is preliminarily formed with three openings 289, 290 and 291. The larger openings 289 and 290 are prepared for integrally connecting the boss projections 280 and 281 with the lumps 285 and 286, respectively, while the smaller opening 291 is prepared for integrally connecting the corner portion 287 of the runner 282 with the lump 288. Then, the base plate B is sandwiched between the upper and lower molding blocks $M_1 M_2$. The upper molding block $M_1$ has two recesses 292 and 293, which correspond with the configuration of the boss projections 280 and 281, respectively, and also a L-shaped groove 294 for connecting the two recesses 292 and 293. On the other hand, the lower molding block $M_2$ has three shallow recesses 295, 296 and 297 for molding the lumps 285, 286 and 288, respectively.

It should be noted that the upper molding block $M_1$ is further formed with a groove 298 extending from the recess 292 towards one of the neighboring recess (not shown) for receiving the molten synthetic resin therefrom into the recess 292 and further to the recess 293.

After effecting the molding process in the same manner as described above, the ejected runner 282 may shrink for some degrees, in the process of cooling.

Referring to FIG. 75, if the runner 282 were not provided with the lump 288 which fixedly support the corner portion 287 thereof on the base plate B, the shrinking force in the runner 282 not only effect the L-shaped runner 282' to stretch, but also effect the boss projection 281 to be twisted in clockwise direction, as shown in dotted line in FIG. 75. However, according to the L-shaped runner 282 of the present invention, the L-shaped runner 282 is fixedly provided on the base plate at the corner portion 287, the shrinking of the runner 282 proceeds within the straight sections of the L-shaped runner 282. In other words, the effect of the shrinking force in one of the straight section of the L-shaped runner is absorbed within the same straight section, while the effect of the shrinking force in the other straight section is absorbed within the same straight section. Therefore, the shrinking force of the runner 282 effects each of the boss projections only in their radial direction, thus producing no twisting force on the boss projection 281, resulting in precise positioning of the boss projection 281.

It should be noted that the runner 282 described as formed in the shape of L, can be formed in any zigzag form, in relation to the configuration of the component to be placed between the boss projections 280 and 281. In this case, the lump may be formed at the nearest corner portion to the boss projection.

It should also be noted that the runner 282 described as formed on the upper surface of the base plate B, can be formed on lower surface of the base plate B.

Since the L-shaped runner 282 is fixedly installed on the base plate at corner portion 287, the shrinking force of the L-shaped runner is intercepted at corner portion 287 thereof, thus preventing relatively effecting the shrinking force. Therefore, the boss projections do not receive any twisting force by the L-shaped runner 282.

ITEM 13

Figure 76:
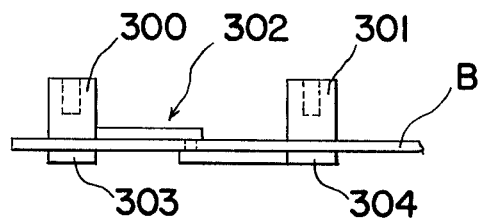
FIG. 76 is a fragmentary side elevational view of a runner connection the two boss projections.
Figure 77:
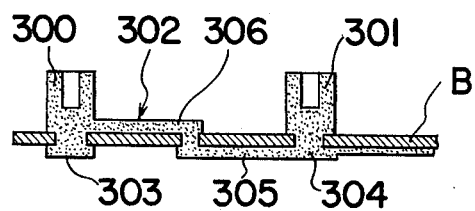
FIG. 77 is a fragmentary side sectional view of a runner showing a detailed construction thereof.
Figure 78:
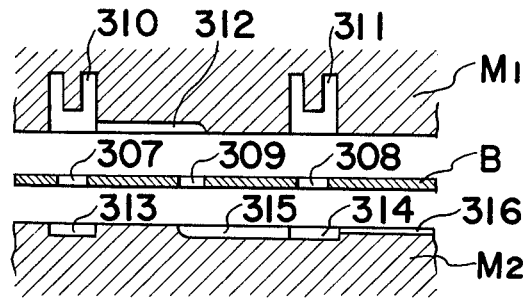
FIG. 78 is a fragmentary side sectional view showing the relation between the base plate and the upper and lower molding blocks for forming the boss projection together with the runner shown in FIG. 76.

Referring to FIGS. 76 and 77, there is shown completed piece of the two boss projections 300 and 301, being connected by a runner 302. Each of the two boss projectins 300 and 301 is fixedly installed on the base plate B by lumps 303 and 304 formed immediately below the base plate B at positions opposing the boss projections 300 and 301, respectively. The runner 302, extended between the two boss projections 300 and 301 has two sections. The section 305, formed immediately below the base plate B extends from the lump 304 towards the other lump 303, but only up to a little more than a half the distance between the two lumps 303 and 304, in the similar manner the section 306, formed on the upper surface of the base plate B extends from the base portion of the boss projection 300 toward the base portion of the other base projection 301, but only up to a little more than a half the distance between the two boss projections 300 and 301, so that in the middle portion of these two boss projections 300 and 301, the end portion of the section 305 overlaps with the end portion of the section 306, via base plate B existing between these two sections 305 and 306. In said middle portion, these two sections 305 and 306 are integrally connected to each other, as best shown in FIG. 77.

In order to form the two boss projections 300 and 301 being connected with such runner 302, the base plate B is preliminarily formed with three openings 307, 308 and 309, as shown in FIG. 79. The larger openings 307 and 308 are prepared for integrally connecting the boss projections 300 and 301 with the lumps 303 and 304, respectively, while the smaller opening 309 is prepared for integrally connecting the runner in the section 306 with the same in the section 305. Then, the base plate B is sandwiched between the upper and lower molding blocks $M_1$ and $M_2$. The upper molding block $M_1$ has two recesses 310 and 311 for molding the boss projections 300 and 301, and also a groove 312 extending from the recess 310 toward the other recess 311, but only up to a little more than a half the distance between the two recesses 310 and 311. On the other hand, the lower molding block $M_2$ has two shallow recesses 313 and 314 for molding the lumps 303 and 304, and also a groove 315 extending from the shallow recess 314 towards the other shallow recess 313, but only up to a little more than a half the distance between the two recesses 313 and 314.

It should be noted that the shallow recess 314 is further connected with another groove 316 for receiving the molten synthetic resin therethrough into the recesses 311 and 310.

After effecting the molding process in the same manner as described above, the ejected runner 302 may shrink to some degrees, mostly in the longitudinal direction thereof, in the process of cooling. Since the runner 302 connecting the two boss projections 300 and 301 is divided into two sections 305 and 306, the amount of shrinkage produced in each section is not as large as the amount of shrinkage in the runner which directly connects two boss projections.

Figure 80:
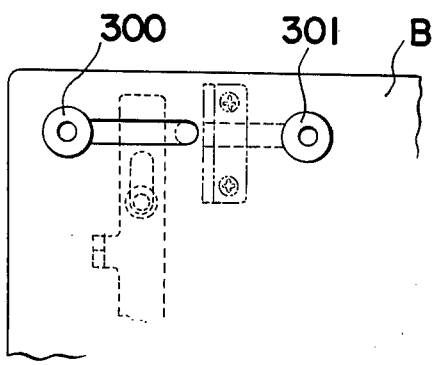
FIG. 80 is a fragmentary top plan view of the base plate formed with the boss projection and runner shown in FIG. 76, and also provided with the composing elements for the framework.

Furthermore, since the runner extends only up to approximately half the distance between the boss projections, it is possible to provide some component or components directly on the base plate in the rest of the opened space between the two boss projections 300 and 301, as shown in FIG. 80.

It should be noted that the runner 302 described as formed in two separate sections 305 and 306, can be formed by more than two sections alternately above and below the base plate B, in relation to the distance between the two boss projections, or in relation to the positioning of the component to be installed on the base plate.

Since the runner 302 is divided into two sections, the shrinking force of the runner 302 is reduced to half when compared with a runner shown in FIG. 57, resulting in less shrinking force effecting on the boss projections. Furthermore, since the runner 302 only covers half the way between the boss projections, it is possible to install some components on the other half.

ITEM 14

Figure 81:
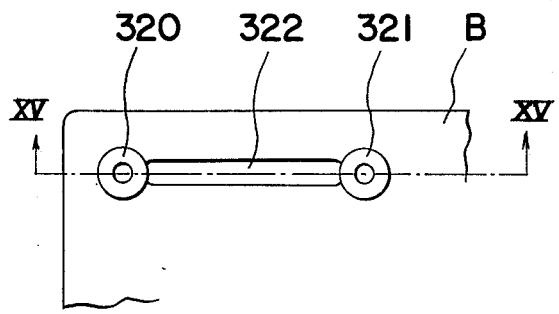
FIG. 81 is a fragmentary top plan view of a runner connecting the two boss projections.
Figure 82:
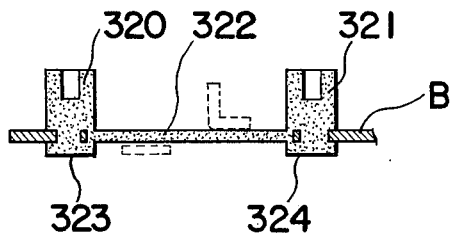
FIG. 82 is a cross sectional view taken along the line XV—XV in FIG. 81.

Referring to FIGS. 81 and 82, there is shown completed pieces of two boss projections 320 and 321, being connected by a runner 322. Each of the two boss projections 320 and 321 are fixedly installed on the base plate B by lumps 323 and 325 formed immediately below the boss projections 320 and 321, respectively. The runner 322, extended between the two boss projections 320 and 321 is completely buried in the base plate B, as best shown in FIG. 82.

Figure 83:
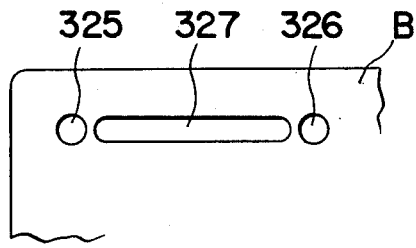
FIG. 83 is a fragmentary top plan view of the base plate showing openings for forming the boss projections together with the runner shown in FIG. 81.
Figure 84:
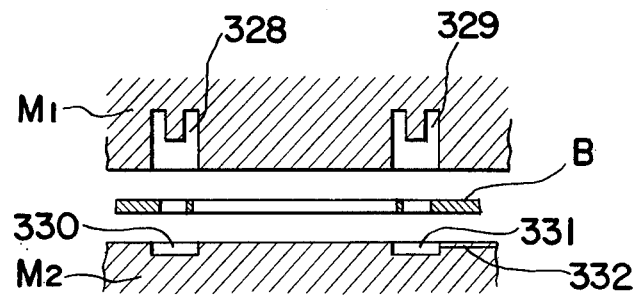
FIG. 84 is a fragmentary side sectional view showing the relation between the base plate and the upper and lower molding blocks for forming the boss projections and the runner shown in FIG. 81.

In order to form the two boss projections 320 and 321 being connected with such runner 322, the base plate B is preliminarily formed with three openings 325, 326 and 327, as best shown in FIG. 83.

The openings 325 and 326 are prepared for integrally connecting the boss projections 320 and 321 with the lumps 323 and 324, respectively, while the elongated opening 327 formed in the space between the openings 325 and 326 is prepared for forming the runner 322 therein. Then the base plate B is sandwiched between the upper and lower molding blocks $M_1$ and $M_2$. The upper molding block $M_1$ has two recesses 328 and 329, while the lower molding block $M_2$ has two shallow recesses 330 and 331.

It should be noted that the size of the opening of the recess 328 formed in the upper molding block $M_1$ and the same of the shallow recess 330 formed in the lower molding block have such a large opening to cover, when sandwiching the base plate B, not only the opening 325 formed in the base plate B, but also a part of the elongated opening 327. In the similar manner, the opening of the other recess 329 formed in the upper molding block $M_1$ and the same of the shallow recess 331 formed in the lower molding block $M_2$ also covers a part of the elongated opening 327, together with the opening 326 formed in the base plate B so that the cavity for the boss projections 320 and 321 can be connected with the elongated opening when the upper and lower molding blocks $M_1$ and $M_2$ sandwich the base plate B.

It should be noted that the shallow recess 331 must be connected with a groove 332 for receiving the molten synthetic resin therethrough into the cavity.

After proceeding the molding process in the same manner as described above, the ejected runner 322 may shrink to some degrees, mostly in the longitudinal direction thereof, in the process of cooling. Since the runner 322, connecting the two boss projections 320 and 321 is completely buried in the elongated opening 327, the shrinking force of the runner can be absorbed in the elongated opening 327, thus exerting no serious force on the boss projections 320 and 321 to deform the configurations thereof. Furthermore, since the runner 322 is not projecting from the surfaces of the base plate B, it is possible to provide some component or components in any space between the two boss projections 320 and 321.

It should be noted that the runner 322 described as molded in the elongated opening 327 can be molded in a elongated groove formed at least on one side of the base plate B.

Figure 85:
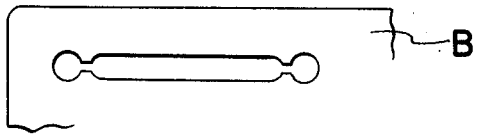
FIG. 85 is a similar view to FIG. 83, but particularly shows a modification thereof.

It should also be noted that the elongated opening described as formed in the space between the two openings 325 and 326 can be connected with the openings 325 and 326 at their opposite ends, as shown in FIG. 85, and also can be provided with numbers of branches to form more runners for connecting more than two projections.

Since the runner 322 connecting the two boss projections is mounted in the opening 327, the effect of the shrinking force of the runner 322 is limited in the opening 327, thus preventing said shrinking force from affecting the boss projections. Furthermore, since the runner 322 does not project from the surface of the base plate B, it is possible to lay some components across the runner 322 without difficulty.

It should be noted that the base plate described as composed of metallic plate can be replaced by any other type of plate as long as the plate does not deform in the configuration thereof at the melting temperature of the synthetic resin.

It should also be noted that the various runners described as employed for connecting boss projections is not necessarily used for connecting the boss projections, but may be used for connecting any other types of the synthetic resin projections.

It should also be noted that the boss projections or any other projections described as fixedly formed on the upper surface of the base plate, can be formed on the lower surface of the base plate, when it is necessary, by a suitable recess formed in the lower molding block.

As described in detail hereinabove, the synthetic resin projections to be installed on the base plate to construct the framework, can all be formed at once by the process of molding, and yet the positioning of each of the projections can be effected with accuracy.

Although the present invention has been fully described by way of examples with reference to the attached drawings, it is to be noted that various changes and modifications are apparent to those skilled in the art. Therefore, unless otherwise, such changes and modifications depart from the scope of the present invention, they should be construed as included therein.

What is claimed is:

1. A hybrid framework assembly for use in electrical or mechanical devices as a substratum and capable of being formed by a process of injection molding, and for supporting various components incorporated in said devices, said hybrid framework assembly comprising;
   a. a metallic base having opposite surfaces and at least one opening therein between said surfaces;
   b. at least one projection on said metallic base plate and made of synthetic resin and having a base face thereof attached to said metallic base plate on a first of said surfaces of said metallic base plate adjacent said opening and being larger than said opening and having a portion of said projection extending over said opening, said projection having a constricted portion integrally formed therewith extending into and through said opening, and a lump of synthetic resin on the second of said surfaces of said metallic base plate and integrally formed with said constricted portion, said lump of synthetic resin at least partially covering said opening for tightly holding said projection permanently on said metallic base plate.

2. A hybrid framework assembly as claimed in claim 1, wherein said projection further has at least one thin-gauged extending arm along said first surface of said metallic base plate, whereby said thin-gauged extending arm serves as leaf spring means due to its elasticity.

3. A hybrid framework assembly as claimed in claim 2, wherein said thin-gauged extending arm is in the shape of a "U".

4. A hybrid framework assembly as claimed in claim 1, wherein there are a plurality of openings and a plurality of projections in the openings aligned in a line and spaced from each other and each projection having a straight groove in the end thereof remote from the surface of the base plate and the grooves in said plurality of projections being aligned in a single line.

5. A hybrid framework assembly as claimed in claim 1, wherein there are a plurality of openings and a plurality of projections in the openings, the projections being divided into first and second groups, said projections in said first group being aligned and spaced from each other for defining a first imaginary plane perpendicular to said first of said surfaces of said metallic base plate, said projections in said second group being aligned and spaced from each other for defining a second imaginary plane parallel to said first imaginary plane and said first and second imaginary planes facing each other and defining an elongated groove.

6. A hybrid framework assembly for use in electrical or mechanical devices as a substratum for supporting various components incorporated in said devices, said hybrid framework assembly comprising;
   a. a metallic base plate having opposite surfaces and at least two openings therein between said surfaces;
   b. at least two projections on said base plate and made of synthetic resin and each having a base face thereof attached to said metallic base plate on a first of said surfaces of said metallic base plate adjacent a corresponding opening and being larger than said opening and having a portion extending over said opening, each of said projections having a constricted portion integrally formed therewith extending into and through the corresponding opening, and a lump of synthetic resin on the second of said surfaces of said metallic base plate corresponding to each projection and integrally formed with the corresponding constricted portion, said lumps of synthetic resin being larger than said openings for tightly holding said projections permanently on said metallic base plate; and
   c. at least one runner means connected between said two projections.

7. A hybrid framework assembly as claimed in claim 6, wherein said runner means comprises;
   a. a first runner portion extending between said two projections on the first of said surfaces of said metallic base plate in alignment with an imaginary line extending between said two projections; and
   b. a second runner portion extending between said two lumps on the second of said surfaces of said metallic base plate in alignment with an imaginary line extending between said two lumps.

8. A hybrid framework assembly as claimed in claim 7, wherein said lines are straight lines.

9. A hybrid framework assembly as claimed in claim 6, wherein said runner means connected between said two projections is generally in alignment with an imaginary straight line extending between said two projections and has at least one portion which deviates from said imaginary straight line.

10. A hybrid framework assembly as claimed in claim 9, wherein said deviating runner portion is in the form of an arc.

11. A hybrid framework assembly as claimed in claim 9, wherein said deviating runner portion has a zigzag form.

12. A hybrid framework assembly as claimed in claim 6, wherein said runner means connected between said two projections in alignment with an imaginary line extending between said two projections has at least one narrowed portion therein.

13. A hybrid framework assembly as claimed in claim 6, wherein said metallic base plate has an additional opening, a first portion of said runner means extending between one of said two projections and said additional opening and a second portion of said runner means extending between the other of said two projections and said additional opening, and a runner connecting portion connecting said first and second runner portions to each other at said additional opening and being a constricted member of synthetic resin provided in said further opening, said constricted member having integrally formed therewith first and second lumps of synthetic resin on the first and second surfaces of said metallic base plate, respectively.

14. A hybrid framework assembly as claimed in claim 13, wherein said first and second runner portions are on the first of said surfaces of said metallic base plate.

15. A hybrid framework assembly as claimed in claim 13, wherein said first and second runner portions are on the second of said surfaces of said metallic base plate.

16. A hybrid framework assembly as claimed in claim 13, wherein said first and second runner portions are on both the first and second surfaces of said metallic base plate, respectively.

17. A hybrid framework assembly as claimed in claim 6, wherein said metallic base plate has at least two additional openings adjacent the respective projections, a first runner portion of said runner means extending between one of said two projections and said additional opening adjacent said one projection, a second runner portion of said runner means extending between the other of said two projections and said additional opening adjacent said other projection and a third runner portion of said runner means extending between said two additional openings, a first constricted member of synthetic resin in said additional opening adjacent said one projection and connecting said first and third runner portions to each other at said additional opening adjacent said one projection, and a second constricted member of synthetic resin in said additional opening adjacent said other projection and connecting said second and third runner sections to each other at said opening adjacent said other projection, said first and second constricted members having integrally formed therewith first and second lumps of synthetic resin on the first and second surfaces of said metallic base plate, respectively.

18. A hybrid framework assembly as claimed in claim 17, wherein said first, second and third runner portions are provided on the first of said surfaces of said metallic base plate.

19. A hybrid framework assembly as claimed in claim 6, wherein said metallic base plate has at least one additional opening therein, said additional opening being an elongated opening extending between said two openings, and said runner means extending through said elongated opening in said metallic base plate across the thickness of said metallic base plate and connecting said two projections to each other.

* * * * *